United States Patent
Jun et al.

(10) Patent No.: US 12,119,846 B2
(45) Date of Patent: *Oct. 15, 2024

(54) COMPRESSING DEVICE AND METHOD USING PARAMETERS OF QUADTREE METHOD

(71) Applicant: Samsung Electronics Co., Ltd., Suwon-si (KR)

(72) Inventors: Sungho Jun, Hwaseong-si (KR); Junseok Park, Hwaseong-si (KR); Sangmin Suh, Seoul (KR); Heonsoo Lee, Hwaseong-si (KR); Hyukjae Jang, Suwon-Si (KR); Kyungah Jeong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

This patent is subject to a terminal disclaimer.

(21) Appl. No.: 18/095,039

(22) Filed: Jan. 10, 2023

(65) Prior Publication Data
US 2023/0144499 A1    May 11, 2023

Related U.S. Application Data

(63) Continuation of application No. 17/183,471, filed on Feb. 24, 2021, now Pat. No. 11,569,843.

(30) Foreign Application Priority Data

May 7, 2020  (KR) .......................... 10-2020-0054770

(51) Int. Cl.
 H03M 7/40   (2006.01)
 G06N 3/02   (2006.01)
 H03M 7/30   (2006.01)

(52) U.S. Cl.
 CPC .............. H03M 7/405 (2013.01); G06N 3/02 (2013.01); H03M 7/3066 (2013.01)

(58) Field of Classification Search
 CPC ........................... H03M 7/405; H03M 7/3066
 See application file for complete search history.

(56) References Cited

U.S. PATENT DOCUMENTS

| | | | |
|---|---|---|---|
| 5,079,630 A | 1/1992 | Golin et al. | |
| 5,225,904 A | 7/1993 | Golin et al. | |
| 7,958,096 B2 | 6/2011 | Perrizo | |
| 8,086,052 B2 | 12/2011 | Toth et al. | |
| 8,942,290 B2 | 1/2015 | Ameres et al. | |
| 9,479,786 B2 | 10/2016 | Lu et al. | |
| 10,594,338 B1* | 3/2020 | Lew | H03M 7/4043 |
| 10,938,411 B1* | 3/2021 | Whiteman | G06N 3/048 |
| 2010/0322307 A1 | 12/2010 | Thyagarajan | |
| 2017/0293659 A1 | 10/2017 | Huang | |
| 2018/0131946 A1* | 5/2018 | Lee | G06V 10/82 |

(Continued)

*Primary Examiner* — Lam T Mai
(74) *Attorney, Agent, or Firm* — Muir Patent Law, PLLC

(57) ABSTRACT

A device configured to compress a tensor including a plurality of cells includes: a quadtree generator configured to generate a quadtree searching for a non-zero cell included in the tensor and extract at least one parameter value from the quadtree; a mode selector configured to determine a compression mode based on the at least one parameter; and a bitstream generator configured to generate a bitstream by compressing the tensor based on the compression mode.

20 Claims, 17 Drawing Sheets

(56) References Cited

U.S. PATENT DOCUMENTS

| | | |
|---|---|---|
| 2018/0288419 A1 | 10/2018 | Yu et al. |
| 2018/0300606 A1* | 10/2018 | Corkery ................ G06F 1/3287 |
| 2019/0115933 A1 | 4/2019 | Chen et al. |
| 2020/0193273 A1* | 6/2020 | Chung .................... G06F 17/16 |
| 2020/0226417 A1* | 7/2020 | Sun ..................... G06F 18/2132 |
| 2020/0364603 A1* | 11/2020 | Oktay ...................... G06N 3/08 |
| 2021/0120248 A1* | 4/2021 | Chong ................... H04N 19/13 |
| 2021/0350240 A1* | 11/2021 | Persson ............... H03M 7/4075 |

* cited by examiner

COMPRESSING DEVICE AND METHOD USING PARAMETERS OF QUADTREE METHOD

CROSS-REFERENCE TO RELATED APPLICATION

This application is a continuation of U.S. application Ser. No. 17/183,471, filed Feb. 24, 2021, in the U.S. Patent and Trademark Office, which claims the benefit of priority under 35 U.S.C. § 119 of Korean Patent Application No. 10-2020-0054770, filed May 7, 2020, in the Korean Intellectual Property Office, the disclosures of both of which are incorporated herein by reference in their entireties.

BACKGROUND

The inventive concept relates to a device and method of compressing data, and more particularly, to a device and method for compressing a tensor by using parameters of a quad tree method using a neural network.

A neural network is implemented with a computational architecture that models a biological brain. Because a neural network processor performs a large amount of computations on large input data, fast processing, storing, and reading of data are required.

The concept of a tensor is used in a neural network structure. The tensor is a generalized expression method of a vector, and one tensor may include a plurality of weights and feature maps. The neural network may use the tensor as a basic processing unit of computation, storage and/or compression.

SUMMARY

The inventive concept provides a neural tensor compressor efficiently compressing a tensor, a neural network processor including the neural tensor compressor, and an operating method of the neural network processor.

The inventive concept provides a quantization method considering data characteristics.

According to an aspect of the inventive concept, there is provided a device configured to compress a tensor including a plurality of cells includes: a quadtree generator configured to generate a quadtree searching for a non-zero cell included in the tensor and extract at least one parameter from the quadtree; a mode selector configured to determine a compression mode based on the at least one parameter; and a bitstream generator configured to generate a bitstream by compressing the tensor based on the compression mode.

According to another aspect of the inventive concept, there is provided a neural network processor including an arithmetic circuit configured to generate a tensor comprising a plurality of cells by performing a computation on input data by using a neural network; and a neural tensor compressor configured to output a bitstream by compressing the tensor, wherein the neural tensor compressor is further configured to generate a quadtree corresponding a repetitive spatial division method to search for a non-zero cell comprised in the tensor, extract at least one parameter from the quadtree, and determine a compression mode of the bitstream based on the at least one parameter.

According to another aspect of the inventive concept, there is provided a method including: receiving a tensor as a result of repeated arithmetic computations performed on a feature map and a weight; extracting at least one parameter, as a result of repeated spatial division of the tensor to compress a zero cell among a plurality of cells comprised in the tensor; determining a compression mode based on the at least one parameter; and outputting a bitstream based on the compression mode.

According to another aspect of the inventive concept, there is provided a compression method of a neural network processor configured to perform computations on a feature map and a weight by using a neural network including: receiving a tensor including a plurality of cells as a result of the computations; setting a quantization range of the tensor based on a largest value of a cell among the plurality of cells; selectively quantizing the tensor based on the quantization range; and compressing the quantized tensor.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
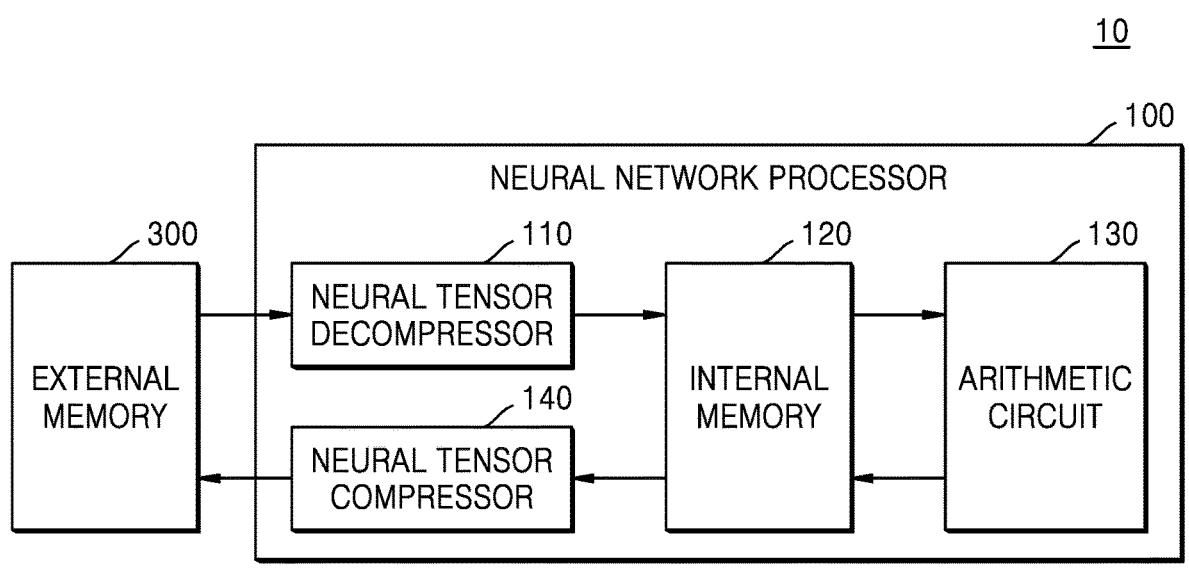
FIG. 1 is a block diagram of an external memory and a neural network processor, according to an example embodiment of the inventive concept.

Hereinafter, embodiments of the inventive concept will be described in detail with reference to the accompanying drawings. In the drawings, like numbers refer to like elements throughout. FIG. 1 is a block diagram of an electronic device 10 including a neural network processor 100 and an external memory 300, according to an example embodiment of the inventive concept.

The electronic device 10 may extract valid information by analyzing input data in real time based on a neural network, determine a situation based on the extracted information, or control at least one component included in the electronic device 10. For example, the electronic device 10 may be applied to a drone, an advanced drivers assistance system (ADAS), a robot device, a smart TV, a smart phone, a medical device, a mobile device, an image display device, a measurement device, an internet of things (IoT) device, and the like, and in addition, may be used as an electronic device of various kinds.

The electronic device 10 may include the neural network processor 100 and the external memory 300. However, the embodiment is not limited thereto, and may further include at least one intellectual property (IP) block. For example, the electronic device 10 may further include at least one IP block that requires processing of the neural network processor 100, such as a storage and a sensor, in addition to the neural network processor 100 and the external memory 300.

The neural network processor 100 may generate a neural network, train (or learn) the neural network, perform a computation based on received input data, and generate an information signal based on the operation result, or retrain the neural network. Models of the neural network may include various kinds of models such as, for example, a convolution neural network (CNN) such as GoogleNet, AlexNet, and VGG network, a region (R) with CNN (RCNN), an R proposal network (RPN), a recurrent neural network (RNN), a stacking (S)-based deep neural network (DNN) (SDNN), a state-space (SS) DNN (SSDNN), a deconvolution network, a deep belief network (DBN), a restricted Boltzmann machine (RBM), a fully convolutional network, a long short-term memory (LSTM) network, and a classification network, but are not limited thereto. The neural network processor 100 may include one or more processors (e.g., central processing units, etc.) for performing computations according to the models of the neural network.

The neural network processor 100 may include a separate memory for storing programs corresponding to the models of the neural network as an internal memory. The neural network processor 100 also may be referred to as a neural network processing device, a neural network integrated circuit, a neural network processing unit (NPU), etc.

According to an example embodiment, the information signal generated by the neural network processor 100 may include at least one of various types of recognition signals such as a voice recognition signal, an object recognition signal, an image recognition signal, and a biometric information recognition signal.

In an example embodiment, the neural network processor 100 may receive frame data included in a video stream as input data, and generate, from the received frame data, a recognition signal for an object included in an image represented by the frame data. For example, the neural network processor 100 may generate a face recognition signal based on input data that is the frame data provided by a camera.

In an example embodiment, the neural network processor 100 may receive frequency data included in an audio stream as input data, and generate a voice recognition signal for a voice extracted from the frequency data. As another example, however, the inventive concept is not limited thereto, and the neural network processor 100 may receive various types of input data, and generate the recognition signal according to the input data.

Because a lot of data having zero values is generated due to computational characteristics of the neural network, the neural network processor 100 may compress data by removing data having zero values.

According to an example embodiment of the inventive concept, the neural network processor 100 may remove a zero cell having 0 as a data value among a plurality of cells included in an input feature map data that is used in the convolution computation, and compress the data by using the data value of a non-zero cell that does not have 0 as the data value and using a location information of the non-zero cell. The neural network processor 100 may improve a speed of processing, storing, loading, and reading data by compressing the data. In addition, the neural network processor 100 may increase a data input/output speed by storing the compressed data in the external memory 300 or loading the compressed data from the external memory 300.

The neural network processor 100 may include a neural tensor decompressor 110, an internal memory 120, an arithmetic circuit 130, and a neural tensor compressor 140.

The neural tensor decompressor 110 may load data stored in a compressed form in the external memory 300, and decompress the data. In an example embodiment, the neural tensor decompressor 110 may decompress, in a reverse order, the data that has been compressed by the neural tensor compressor 140. For example, the neural tensor compressor 140 may compress data, and the neural tensor decompressor 110 may decompress the compressed data in a reverse order to that of the compression process performed by the neural tensor compressor 140.

In an example embodiment, the neural tensor decompressor 110 may determine a compression algorithm in which data has been compressed, by referring to a memory address in the external memory 300 in which the data has been stored, and may decompress the compressed data based on the determined compression algorithm. The external memory 300 may include a storage area corresponding to a compression mode. For example, the external memory 300 may include a first storage area corresponding to a first compression mode, a second storage area corresponding to a second compression mode, and a third storage area corresponding to a third compression mode. The neural tensor decompressor 110 may determine the compression mode from a storage area (that is, a memory address of the storage area) that loads data, and may apply a decoding method according to the compression mode. According to the technical idea of the inventive concept, because data may be decompressed according to the storage area, a stored bitstream may not include bit information for the compression mode. The decompressed data may be temporarily stored in the internal memory 120.

The internal memory 120 may temporarily store the decompressed data, or temporarily store a computation result (for example, a tensor) that is output from the arithmetic circuit 130.

The internal memory 120 may temporarily store data in use, for fast data processing in the neural network processor 100. Because a data processing bandwidth between the neural network processor 100 and the external memory 300 arranged outside the neural network processor 100 is limited, the neural network processor 100 may separately include the internal memory 120 for fast data processing. In an example embodiment, the internal memory 120 may have a faster processing speed and a higher stability than the external memory 300, but is not limited thereto. For example, the internal memory 120 may include static random access memory (RAM) (SRAM), and the external memory 300 may include dynamic RAM (DRAM) and synchronous DRAM (SDRAM).

The arithmetic circuit 130 may receive input data including the input feature map and a weight from the internal memory 120. The arithmetic circuit 130 may generate the tensor by performing the convolution computation by using the received input feature map and weight. The tensor may include the feature map and the weight.

The arithmetic circuit 130 may repeatedly perform arithmetic computations on the input feature map and weight. The arithmetic circuit 130 may perform multiplication, division, addition, subtraction, and logical computations, and may be referred to as a multiplier-accumulator (MAC). The arithmetic circuit 130 may solve complex mathematical computations (for example, differentiation and integration) with a combination of arithmetic computations of the input feature map and weight.

The neural tensor compressor 140 may load the computation result output from the arithmetic circuit 130 via the internal memory 120. The computation result output from the arithmetic circuit 130 may be referred to as the tensor. The tensor may be a generalized representation of a vector, and may include a plurality of cells. In an example embodiment, the plurality of cells may, by being arranged in a matrix form, constitute the feature map, and there may be a plurality of feature maps depending on a depth of the neural network. The neural network processor 100 may process data in tensor units. The neural tensor compressor 140 may compress the tensor, and store the compression result in the external memory 300.

In an example embodiment, the neural tensor compressor 140 may output the generated bitstream in the storage area corresponding to the compression mode. As described above, the external memory 300 may include the storage area corresponding to the compression mode. For example, the external memory 300 may include a first storage area corresponding to a first compression mode, a second storage area corresponding to a second compression mode, and a third storage area corresponding to a third compression mode. For example, a bitstream based on the first compression mode may be output to the first storage area, a bitstream based on the second compression mode may be output to the second storage area, and a bitstream based on the third compression mode may be output to the third storage area. According to the technical idea of the inventive concept, because data may be stored in a different space in response to the compression mode, the bitstream may not include bit information for the compression mode.

The neural tensor decompressor 110, the arithmetic circuit 130, and the neural tensor compressor 140 may be implemented with processing circuits such as hardware including logic circuits, or may be implemented with a combination of hardware and software such as a processor executing software that performs a compression operation. In particular, a processing circuit may be implemented with a central processing unit (CPU), an arithmetic logic unit (ALU) that performs arithmetic and logical computations, bit shifting, and the like, a digital signal processor (DSP), a microprocessor, and an application specific integrated circuit (ASIC), or the like, but is not limited thereto.

For convenience of description in the present specification, a cell having a value of 0 as a data value among a plurality of cells included in a tensor may be referred to as a zero cell, and a cell having a value other than 0 as a data value among a plurality of cells may be referred to as a non-zero cell. Due to neural network computational characteristics, a ratio of zero cells present in the tensor may be high.

Figure 2:
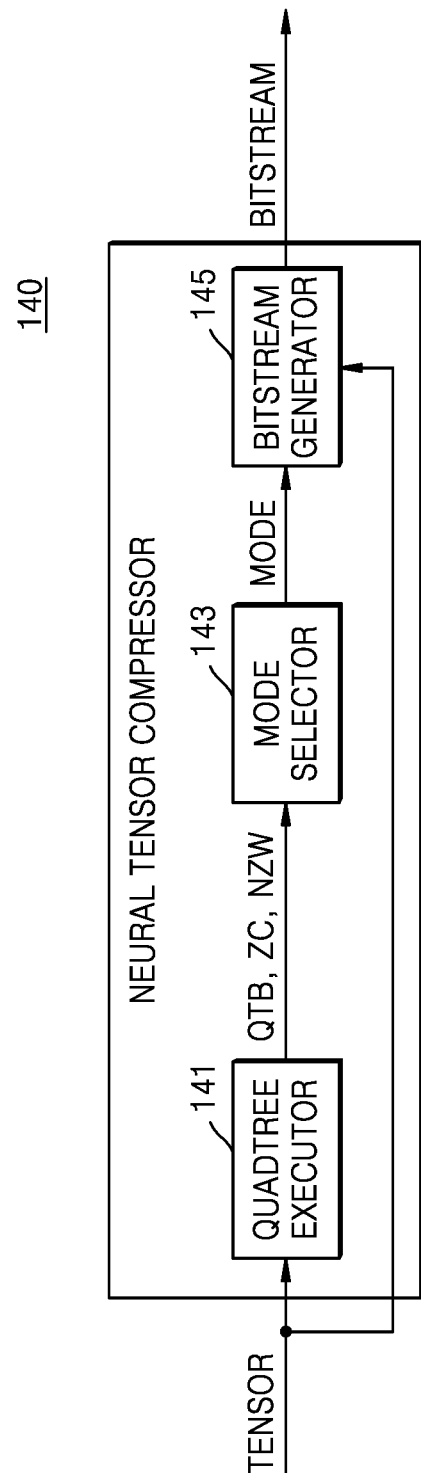
FIG. 2 is a block diagram of a neural tensor compressor according to an example embodiment of the inventive concept.

FIG. 2 is a block diagram of the neural tensor compressor 140 according to an example embodiment of the inventive concept.

The neural tensor compressor 140 may include a quadtree generator 141, a mode selector 143, and a bitstream generator 145.

The quadtree generator 141 may generate a quadtree for searching for a non-zero cell included in the tensor. The quadtree may be a data structure that divides space hierarchically into four squares. In an example embodiment, the quadtree generator 141 may designate a region where the non-zero cell does not exist as 0 by repeatedly spatially dividing the tensor into 4 areas, and designate a region where the non-zero cell exists as 1. All cells included in the region designated as 0 may have a cell value of "0" and be compressed, and the cells included in the region designated as 1 may be spatially divided again to search for the non-zero cells in the next lower layer. The quadtree generator 141 may, by generating the quadtree for the tensor, maximum bit data representing information about a maximum bit width of the non-zero cell, cell location data representing the location information about the non-zero cell, and at least one tensor data including non-zero data representing a value of the non-zero cell.

The quadtree generator 141 may include a non-zero buffer (not illustrated). The non-zero buffer may buffer the non-zero cell included in an input tensor.

The quadtree generator 141 may extract at least one parameter from the generated quadtree. In an example embodiment, the quadtree generator 141 may extract a parameter of quadtree bit number QTB corresponding to the number of bits generated as the compression result of the quadtree, and a parameter of non-zero cell bit width NZW corresponding to a maximum bit width of the non-zero cell, and a parameter of zero count ZC corresponding to the number of zero cells, or the zero count, included in the tensor.

In an example embodiment, the quadtree bit number QTB may be generated as the quadtree result, and may correspond to the total number of bits in which the location information of the non-zero cell is represented. In addition, the non-zero cell bit width NZW may correspond to the number of bits from the least significant bit to a bit of the largest digit that is not 0, when a cell having the largest value among the non-zero cells is expressed in binary. In addition, the zero count ZC may correspond to the number of zero cells among the plurality of cells. The quadtree executor 141 may output the quadtree bit number QTB, the zero count ZC, and the non-zero bit width NZW.

The method of generating the quadtree from the tensor and the method of extracting the parameters are described in detail with reference to FIGS. 3A and 3B.

The mode selector 143 may select the compression mode based on at least one of the quadtree bit number QTB, the zero count ZC, and the non-zero bit width NZW received from the quadtree executor 141. In an example embodiment, the mode selector 143 may determine whether a quadtree compression mode is selected based on the quadtree bit number QTB. In an example embodiment, the mode selector 143 may select one of a zero bitmap compression mode and a fixed length compression mode, based on the zero count ZC and the non-zero bit width NZW. The mode selector 143 may output a mode signal MODE commanding the compression mode. The method of selecting a compression mode based on parameters is described in detail with reference to FIG. 4.

The bitstream generator 145 may receive a tensor TENSOR, compress the received tensor TENSOR based on the mode signal MODE, and output the compression result as a bitstream BITSTREAM. In an example embodiment, the bitstream generator 145 may generate the bitstream BITSTREAM based on the mode signal MODE. The mode signal MODE may include at least one of a signal commanding the quadtree compression mode, a zero bitmap compression mode signal, and a fixed length compression mode signal.

The bitstream generator 145 may compress the provided tensor TENSOR based on the quadtree, based on the mode signal MODE commanding the quadtree compression mode. However, the inventive concept is not limited thereto, and the bitstream generator 145 may compress the tensor TENSOR without re-generating the quadtree by using the result used in the quadtree generator 141, based on the mode signal MODE commanding the quadtree compression mode.

Because in many cases, a rectified linear unit (ReLU) operation that converts a negative number to 0 is applied to the convolution computation of the neural network, many zero cells may be distributed in the feature map. When the non-zero cells gather in a particular region even though they have occurred in the feature map, a compression efficiency may not be significantly reduced. However, when the non-zero cells are sporadically distributed in the feature map, an overhead phenomenon in which a size of data subjected to the quadtree compression is greater than a size of uncompressed data may occur.

The neural tensor compressor 140 and the neural network processor 100 including the neural tensor compressor 140 according to the technical idea of the inventive concept may increase the compression efficiency compared with compression without considering the zero cell, by adaptively compressing a tensor TENSOR having a characteristic that the number of cells having zero values is small. In addition, because the neural tensor compressor 140 according to the technical idea of the inventive concept may determine the compression mode by using a parameter that is extracted when the tensor TENSOR is compressed based on the quadtree, the speed of determining the compression mode may be faster, and accordingly, the compression speed may be improved, and thus an implementation thereof may be easy.

In addition, the neural tensor compressor 140 according to the technical idea of the inventive concept may reduce data loss and increase the compression efficiency by quantizing only a portion of the plurality of cells considering characteristics in which the plurality of cells included in the tensor are mainly distributed in a region of low cell values.

Figure 3A:
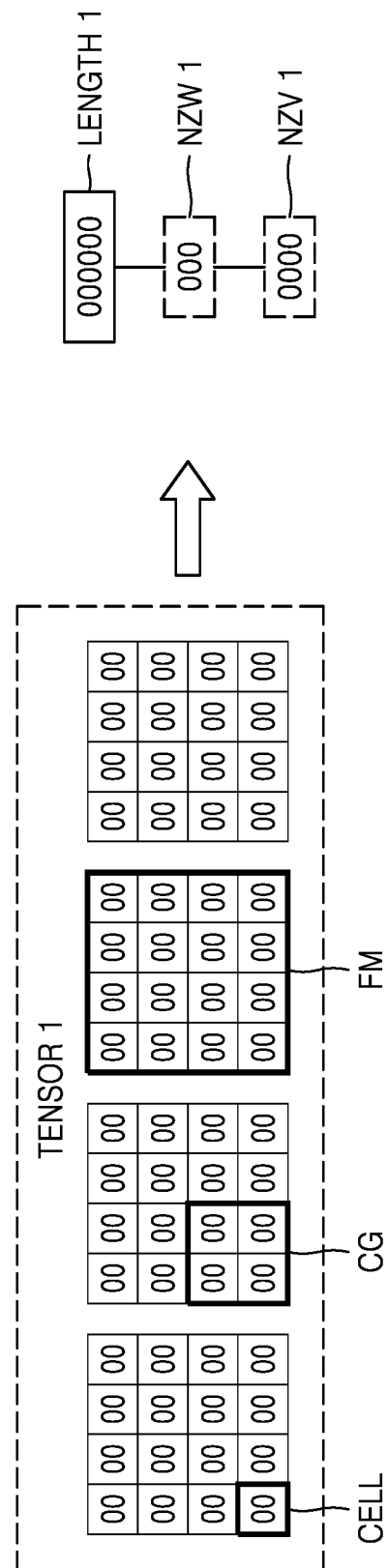
FIGS. 3A and 3B are diagrams illustrating a quadtree-based compressing method that is performed in a quadtree generator, according to example embodiments of the inventive concept.
Figure 3B:
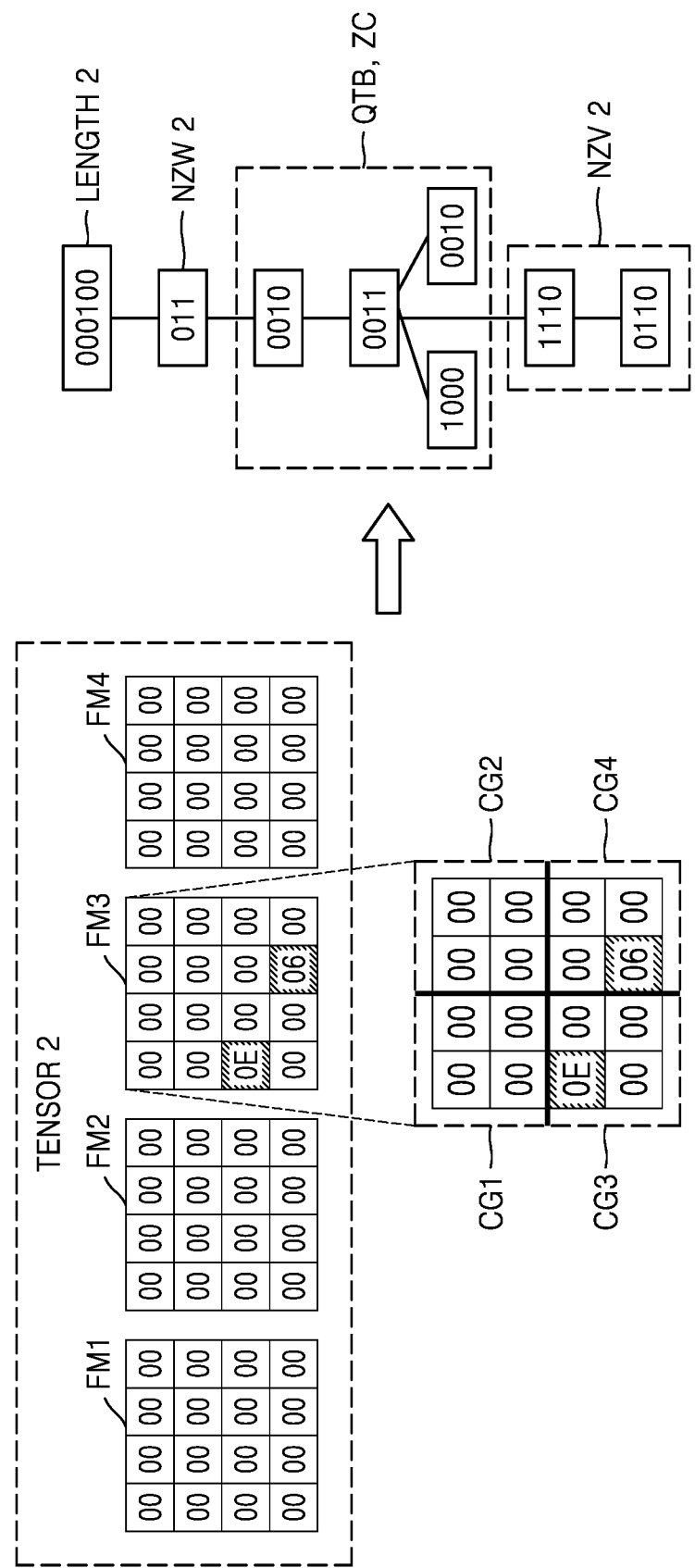

FIGS. 3A and 3B are diagrams illustrating a quadtree-based compressing method that is performed in the quadtree generator 140, according to example embodiments of the inventive concept. FIGS. 3A and 3B are referenced together with FIG. 2.

Referring to FIG. 3A, a tensor TENSOR may include a plurality of feature maps FM, and each feature map FM may be generated by arranging a cell group CG that is a set of cells CELL in a matrix form. For example, a set in which 4 cells CELL are arranged in a 2×2 matrix form may be referred to as the cell group CG, and a set in which 4 cell groups CG are arranged in a 2×2 matrix form may be referred to as the feature map FM, and a set of four feature maps FM may be called a tensor TENSOR. However, the inventive concept is not limited thereto, and in the cell group CG, the cells CELL may be arranged in a 4×4 matrix form, and in the feature map FM, the cell group CG may be arranged in a 4×4 matrix form. The matrix form may vary.

The cell CELL may be a minimum unit representing data, and a cell value may be expressed in hexadecimal. In an example embodiment, because one cell CELL represents two hexadecimal digits, data represented by the cell CELL may include 8 bits (that is, 1 byte). However, the inventive concept is not limited thereto, and the data expressed by the cell CELL may be configured differently according to a data expression format, such as 10 bits or 12 bits.

In the cell group CG, four adjacent cells CELL may be arranged in a 2×2 matrix form, and a size of the cell group CG may be 4 bytes. In an example embodiment, the cell group CG may be referred to as a sub-region of the feature map FM, which is generated when the feature map FM goes through a first quadtree division.

The feature map FM may be generated by arranging the plurality of cells CELL in a 4×4 matrix form. A tensor TENSOR may be formed in an arrangement of four feature maps FM. However, the inventive concept is not limited thereto, and one tensor TENSOR may be formed in an array of various numbers of feature maps FM.

According to an example embodiment, the number of cells included in one tensor TENSOR may depend on a depth of the neural network. For example, when the depth of the neural network is 3, the number of cells CELL may be 64 (that is, $4^3$) which is a result of having 4 cells CELL in 3 respective direction axes, that is, a width direction axis, a height direction axis, and a channel direction axis. In this case, the feature map FM may be arranged in a form of 4×4 matrix having 4 cells CELL in width and 4 cells CELL in height, and the number of feature maps FM may be 4, which may be the same as the number of cells CELL in the channel direction axis.

For convenience of description, it is illustrated that 64 cells CELL are included in one tensor TENSOR, but the embodiment is not limited thereto. In an example embodiment, assuming that the depth of the neural network is M, the number of cells CELL included in one tensor TENSOR may be N (that is, $4^M$). For example, when the depth of the neural network is 4, the number of cells CELL in one tensor TENSOR may be 256, and when the depth of the neural network is 5, the number of cells CELL in one tensor TENSOR may be 1,024.

The quadtree generator (e.g., quadtree generator 140 in FIG. 2) may compress a first tensor TENSOR1 based on the quadtree method. The quadtree generator 141 may search for the first tensor TENSOR1 in a row direction for the quadtree compression.

The quadtree generator 141 may determine that a first compression length LENGTH1, which is a length of the first tensor TENSOR1 compressed based on the quadtree, is 1. In an example embodiment, the quadtree generator 141 may include a non-zero buffer (not illustrated). The non-zero buffer may buffer the non-zero cell included in an input tensor. According to an example embodiment, the quadtree generator 141 may search for the first tensor TENSOR1 in the row direction for the quadtree compression, and as a result, may identify that a buffered non-zero cell does not exist. The minimum length that is allocated to the tensor to represent that the non-zero cell does not exist (that is, all cells are zero cells) in the first tensor TENSOR1 may be 1 byte. As a result, that the first compression length LENGTH1 is 1 may be understood as that 1 byte has been allocated to indicate a non-existence of the non-zero cell.

According to an example embodiment, the size of data allocated to the first compression length LENGTH1 may be 6 bits. 64 (that is, $4^3$) cells may be included in the first tensor TENSOR1, and one cell may have a size of 1 byte, and thus a length of the first tensor TENSOR1 may be up to 64 (that is, $2^6$) bytes when all cells are non-zero cells.

As a result, information about from 1 byte to 64 bytes may be represented in 6 bits, and the first compression length LENGTH1 may be represented by a binary number $000000_{(2)}$. Because 1 byte includes 8 bits, the remaining two digits may be zero-padded.

Because the non-zero cell included in the first tensor TENSOR1 does not exist, a first non-zero bit width NZW1 that is a bit length of the largest non-zero cell included in the first tensor TENSOR1 and a first non-zero value NZV1 that is a value of the non-zero cell value may all be 0. Because information that the first compression length LENGTH1 is 1 corresponds to information that the non-zero cell is not included in the first tensor TENSOR1, the first non-zero bit width NZW1 and bits of the first non-zero value NZV1 that is the value of the non-zero cell may not be included in the compressed data.

Referring to FIG. 3B, a second tensor TENSOR2 may include four feature maps (for example, FM1, FM2, FM3, and FM4). The quadtree generator (e.g., quadtree generator 140 in FIG. 2) may search for the second tensor TENSOR2 in the row direction for the quadtree compression. The non-zero buffer may buffer the non-zero cell in the second tensor TENSOR2. As a result of the buffering, because the maximum value of the non-zero cell included in the second tensor TENSOR2 is "0E" in hexadecimal (or, $00001110_{(2)}$ in binary), the non-zero bit width NZW may be 4.

In an example embodiment, cell values of the first feature map FM1, the second feature map FM2, and the fourth feature map FM4 in the second tensor TENSOR2 may all be 0, and only the third feature map FM3 may have the non-zero cell (quadtree: $0010_{(2)}$). Each of the first feature map FM1, the second feature map FM2, and the fourth feature map FM4 may be compressed into 1 byte ($00000000_{(2)}$), as illustrated in FIG. 3A.

In an example embodiment, the quadtree may be applied to the third feature map FM3 including the non-zero cell. As a result of applying the quadtree, the third feature map FM3 may be divided into four equal portions with respect to the center, such as an upper left portion, an upper right portion, a lower left portion, and a lower right portion, and the four equally divided portions may be a first cell group CG1, a second cell group CG2, a third cell group CG3, and a fourth cell group CG4, respectively. The non-zero cell may not exist in the first cell group CG1 and the second cell group CG2, and the non-zero cell may exist in the third cell group CG3 and the fourth cell group CG4 (quadtree: $0011_{(2)}$). The compression may be terminated in the first cell group CG1 and the second cell group CG2 in which the non-zero cell does not exist, and the quadtree may be applied once more to the third cell group CG3 (including "0E") and the fourth cell group CG4 (including "06") in which the non-zero cell exists. Only the upper left cell of the third cell group CG3 may have non-zero (quadtree: $1000_{(2)}$), and only the lower left cell of the fourth cell group CG4 may have non-zero (quadtree: $0010_{(2)}$). Because the non-zero cells of the third cell group CG3 and the fourth cell group CG4 have been reached, the quadtree compression may be terminated. Because the non-zero value of the third cell group CG3 is 0E in hexadecimal (i.e., 0x0E), the 0E may be converted into $1110_{(2)}$ in binary. Because the non-zero value of the fourth cell group CG4 is 06 in hexadecimal (i.e., 0x06), the 06 may be converted into $0110_{(2)}$ in binary.

The quadtree generator 141 according to the technical idea of the inventive concept may generate the quadtree having a plurality of parameters as a result of the quadtree compression. The plurality of parameters may include a compressed length LENGTH that is a compressed length of a tensor based on the quadtree, the non-zero bit width NZW that is a bit width of the non-zero cell having the largest value included in the tensor, the zero count ZC that is the number of zero-cells among the plurality of cells included in the tensor, the non-zero value NZV that is a non-zero cell value, and the quadtree bit number QTB that is the number of bits generated as a result of the quadtree compression, but the inventive concept is not limited thereto.

The quadtree generator 141 may extract at least one parameter while applying the quadtree-based compression to the tensor TENSOR.

In an example embodiment, the quadtree generator 141 may identify that a sum of bits generated in the quadtree compression is 33 bits. The 33 bits may not be represented by a 4-byte space, and thus, the quadtree generator 141 may determine that a second compressed length LENGTH2 is 5 bytes (that is, $000100_{(2)}$). Because 5 bytes include 40 bits, the remaining 7 bits other than the 33 bits may be zero-padded.

In an example embodiment, the quadtree generator 141 may determine that a second non-zero bit width NZW2 has 4 bits, based on the cell buffered in the non-zero buffer.

In an example embodiment, because four of 4 bits have been generated as a result of the quadtree compression, the quadtree generator 141 may determine that the quadtree bit number QTB is 16. The quadtree bit number QTB may be in a range of 12 to 84.

In an example embodiment, the quadtree generator 141 may extract the zero count ZC. The zero count ZC may be extracted by subtracting the number of non-zeros buffered in the non-zero buffer from the number of plurality of cells CELL included in the tensor TENSOR.

However, the inventive concept is not limited to the non-zero buffer, and the zero count ZC may be reversely calculated from bits generated as a result of the quadtree compression. For example, among the bits that have been generated as the result of the quadtree compression, bits of the uppermost layer may be $0010_{(2)}$. Because the bits of the uppermost layer correspond to whether the non-zero is in the feature map FM, 0 may be understood to mean that all 16 cells included in one feature map FM are zero cells. For example, three '0's may mean 48 (that is, 16×3) zero counts ZC. Similarly, because bits of the second layer include $0011_{(2)}$ while two '0's exist, and the quadtree has been applied to the second layer once, it may be understood that four cells of the cell group are zero cells. For example, two '0's may mean that the zero count ZC is 8 (that is, 4×2). Similarly, because the quadtree has been applied to a third layer twice while the number of '0's on the third layer is 6, it may be understood that the six '0's mean that 6 cells are the zero cells. As a result, the total zero count ZC may be reversely calculated as 62 (that is, 48+8+6).

Figure 4:
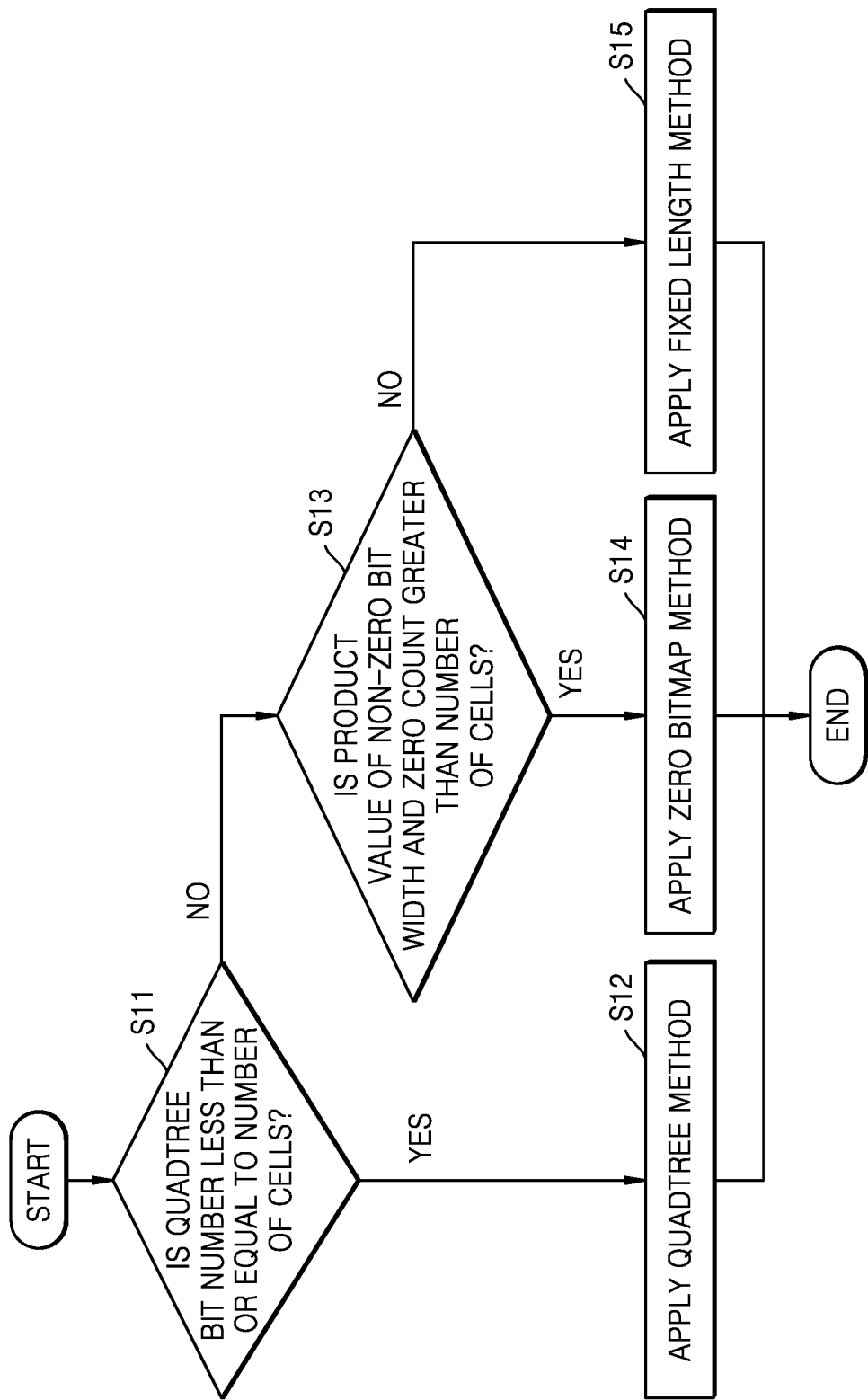
FIG. 4 is a flowchart of a determining method of a compression mode, according to an example embodiment of the inventive concept.

FIG. 4 is a flowchart of a determining method of a compression mode, according to an example embodiment of the inventive concept. FIG. 2 is referenced together with FIG. 4.

When the tensor TENSOR is compressed based on the quadtree method, the quadtree having at least one parameter may be generated. The parameters of the quadtree may include the non-zero bit width NZW that is the bit width of the non-zero cell having the largest value included in the tensor TENSOR, the zero count ZC that is the number of zero-cells among the plurality of cells included in the tensor TENSOR, and the quadtree bit number QTB that is the number of bits generated as a result of performing the quadtree compression, but are not limited thereto.

Referring to FIG. 4, the mode selector (e.g., mode selector 143 in FIG. 2) may compare the quadtree bit number QTB with the number of cells N included in the tensor TENSOR to determine if the quadtree bit number QTB is less than or equal to the number of cells N (S11). The number of cells N may depend on a depth M of the neural network, and it may be satisfied that $N=2^M$.

When the quadtree bit number QTB is less than or equal to the number of cells N (S11, YES), the tensor TENSOR may be compressed based on the quadtree method (S12).

When the quadtree bit number QTB is greater than the number of cells N (S11, NO), the mode selector 143 may compare a product of the non-zero bit width NZW and the zero count ZC with the number of cells N to determine if the product is greater than the number of cells N (S13).

When the product of the non-zero bit width NZW and the zero count ZC is greater than the number of cells N (S13, YES), the tensor TENSOR may be compressed based on a zero bitmap method (S14). The zero bitmap method may be a method in which the non-zero cell is regarded as 1, the zero cell is regarded as 0, and a prefix table including location information about the non-zero cell and the zero cell is used for the compression.

When the product of the non-zero bit width NZW and the zero count ZC is less than or equal to the number of cells N (S13, NO), the tensor TENSOR may be compressed based on a fixed length method (S15). The fixed length method may be a method in which lengths of the cells are fixed to a bit width of a cell having the largest cell value among the plurality of cells without using the prefix table.

According to the technical idea of the inventive concept, it may be required to compare the product of the non-zero bit width NZW and the zero count ZC with the number of cells N. The following formulas may be referenced.

$$(N+NZW \times NZC) > (NZW \times N) \quad \text{[Formula 1]}$$

The left term may correspond to the zero bitmap method, and the right term may correspond to the fixed length method. A direction of an inequality sign may mean a case in which the compression efficiency of the fixed length method is better.

Formula 1 may be summarized as follows.

$$N+NZW \times (N-ZC) > NZW \times N \quad \text{[Formula 2]}$$

Formula 2 may be summarized as follows.

$$N > NZW \times ZC \quad \text{[Formula 3]}$$

In conclusion, according to Formula 3, the mode selector 143 may compare the product of the non-zero bit width NZW and the zero count ZC with the number of cells N, and determine whether the compression efficiency of the fixed-length method is better when the plurality of cell N are greater than the product.

The bitstream generated as a result of the compression applied to the quadtree method, the zero bitmap method, and the fixed length method is described later with reference to FIG. 5.

Figure 5:
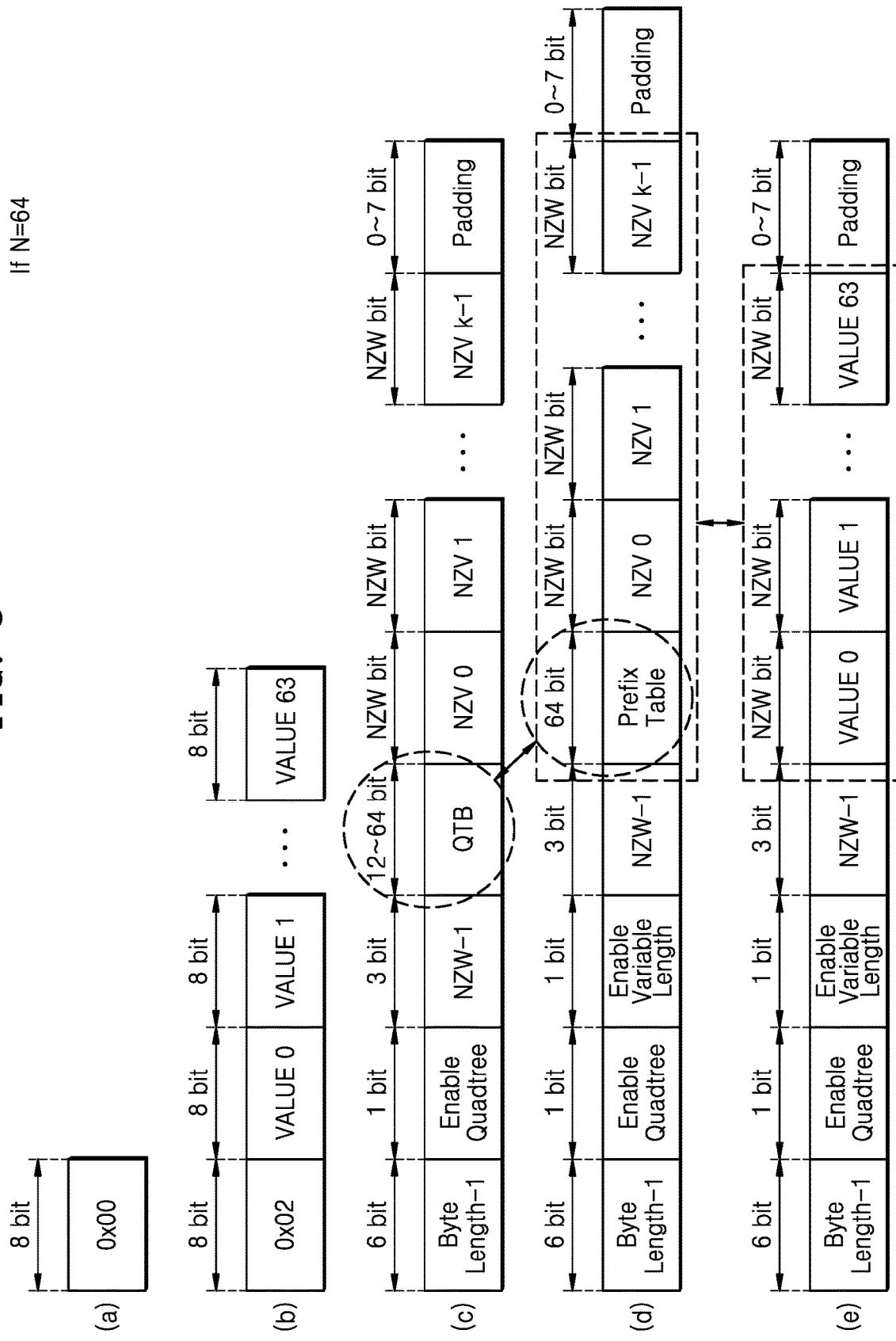
FIG. 5 is a diagram of structures of bitstreams, according to an example embodiment of the inventive concept.

FIG. 5 is a diagram of structures of bitstreams, according to an example embodiment of the inventive concept. FIG. 2 is referenced together with FIG. 5.

Referring to FIG. 5(a), the bitstream generator 145 may generate a zero cell as a bitstream having an 8-bit size. Because one cell has 2-bit information in hexadecimal, one cell may have a size of 8 bits. The cell value of the zero cell may be 0, and when the 0 in decimal is converted into hexadecimal, it may be expressed as 0x00.

Referring to FIG. 5(b), the bitstream generator 145 may generate an uncompressed tensor TENSOR as a bitstream having a size of 8×(N+1). Because N cells are included in the tensor TENSOR, and one cell has a size of 8 bits, an uncompressed bitstream for 8*N cells may be generated, and additionally, 8 bits meaning the maximum value of the cell may be located at the front of the bitstream. For example, when the maximum value of the cell is 2, the maximum value may be expressed as 0x02 in hexadecimal, and $00000010_{(2)}$ in binary and may be located in 8 bits at the front of the bitstream.

Referring to FIG. 5(c), the bitstream generator 145 may generate a bitstream corresponding to the quadtree method selected by the mode selector 143. According to an example embodiment, the bitstream of (c) in FIG. 5 may be generated when the quadtree bit number QTB is equal to or less than the number of cells N.

The bitstream generator 145 may place bits, corresponding to the plurality of cells N included in the tensor TENSOR, in 6 bits at the front of the bitstream. For example, when N is equal to 64, a binary number $111111_{(2)}$ (that is, $63_{(10)}$) may be expressed in a 6-bit size space.

The bitstream generator 145 may write a bit 1 identifying whether the quadtree has been applied in a 1-bit space of the next location.

The bitstream generator 145 may place the bits for the non-zero bit width NZW at the next location. Because the cell has 8-bit information, the maximum non-zero bit width NZW may also be 8 bits. When the non-zero bit width NZW is $1,000_{(2)}$ (that is, 0=NZW−1) in bits may be written in the bit space, and when the non-zero bit width NZW is 8, $111_{(2)}$ (that is, 7=NZW−1) in bits may be written.

The bitstream generator 145 may write bits for the quadtree bit number QTB in the bit space at the next location. In an example embodiment, when N is 64, the quadtree bit number QTB, which is the total number of bits generated as a result of the quadtree compression, may be distributed within a range of 12 to 84. Because (c) in FIG. 5 is determined so that the quadtree compression is performed by the mode selector 143 when the quadtree bit number QTB is less than or equal to the plurality of cells (that is, N is 64), the quadtree bit number QTB may have a distribution range of 12 to 64.

The bitstream generator 145 may write bits for k non-zero values NZV in the bit space at the next location. For example, the bitstream generator 145 may write bits for NZV 0 through NZV k−1. Because the non-zero bit width NZW includes the cell having the largest value among the cells, each of the non-zero values NZV may represent the non-zero value NZV by using only the number of bits corresponding to the non-zero bit width NZW.

The bitstream generator 145 may perform the zero-padding to fit a byte unit to the bit space at the next location.

Because the zero-padding is to fit the byte unit, the number of bits to be zero-padded may be between 0 and 7.

Referring to FIG. 5(d), the bitstream generator 145 may generate a bitstream corresponding to the quadtree method selected by the mode selector 143. According to an example embodiment, the bitstream of FIG. 5(d) may be generated when both the quadtree bit number QTB and a product of the non-zero bit width and the zero count (NZW×ZC) are greater than the plurality of cells N. Duplicate descriptions on the bit space of FIG. 5(c) are omitted.

The bitstream illustrated in FIG. 5(d) may, compared with the bitstream illustrated in FIG. 5(c), show a difference in a bitstream length due to that bits for the prefix table are written instead of the number of quadtree bit number QTB and that bits capable of identifying whether a flexible length has been applied are written. In addition, the bitstream illustrated in FIG. 5(d) may, compared with the bitstream of FIG. 5(c), have a difference that the bits capable of identifying whether the quadtree has been applied are written as 0. The prefix table may include 64-bit information that contains the location information about the non-zero cell and the zero cell by considering the non-zero cell as 1 and the zero cell as 0.

According to an example embodiment, when the quadtree bit number QTB exceeds 64 bits, because the quadtree bit number QTB includes up to 84 bits, the compression efficiency of the zero bitmap method that always uses the prefix table including 64 bits may be better.

Referring to FIG. 5(e), the bitstream generator 145 may generate a bitstream corresponding to the fixed length method selected by the mode selector 143. According to an example embodiment, the bitstream of FIG. 5(e) may be generated when the quadtree bit number QTB is greater than the plurality of cells N, but the product of the non-zero bit width and the zero count (NZW×ZC) is less than or equal to the plurality of cells N. Duplicate descriptions on the bit space of in FIGS. 5(c) and 5(d) are omitted.

The bitstream illustrated in FIG. 5(e) may, compared with the bitstream illustrated in FIG. 5(d), show a difference due to that the prefix table and N of the non-zero values NZV are not used, but values of a fixed length are used, and that bits capable of identifying whether the flexible length has been applied are '1's.

According to an example embodiment, when N is 64, and most of them are the non-zero cells, because it is not necessary to provide the location information, only the largest value of a cell among 64 cells may be determined as the non-zero bit width NZW, and the fixed length compression may be performed. When the product of the non-zero bit width and the zero count (NZW×ZC) is less than or equal to the plurality of cells N, the fixed length method may be better because the 64 bits of the prefix table may be overhead.

Figure 6:
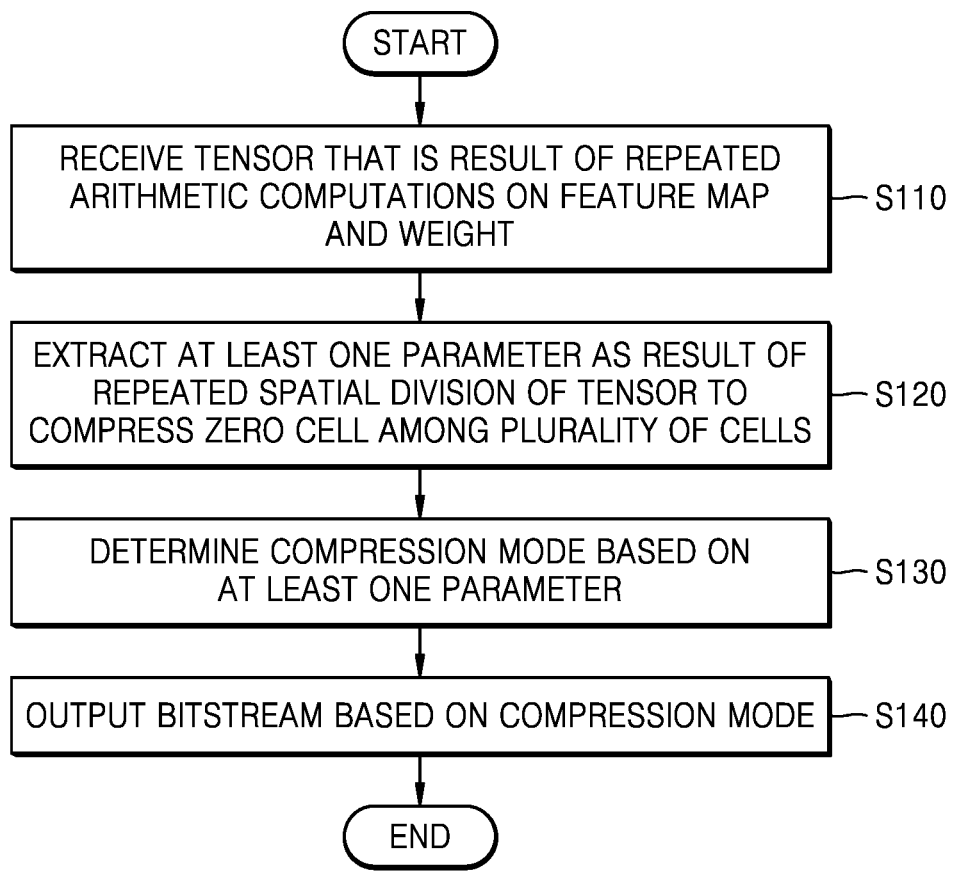
FIG. 6 is a flowchart of an operating method of a neural tensor compressor, according to an example embodiment of the inventive concept.

FIG. 6 is a flowchart of an operating method of the neural tensor compressor 140, according to an example embodiment of the inventive concept.

The neural tensor compressor 140 may receive a tensor that is a result of repeating arithmetic operations on the feature map and the weight (S110).

The neural tensor compressor 140 may extract at least one parameter as a result of the quadtree compression in which the tensor is spatially divided to compress the zero cell among the plurality of cells (S120).

The neural tensor compressor 140 may determine the compression mode based on the at least one parameter (S130).

The neural tensor compressor 140 may output the bitstream based on the compression mode (S140).

Figure 7:
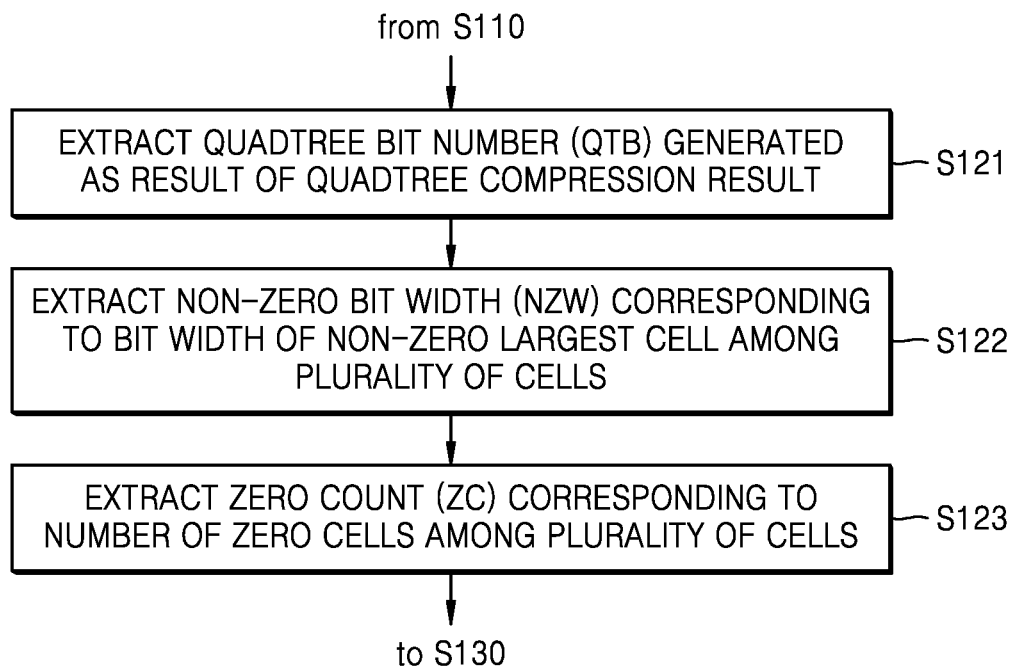
FIG. 7 is a flowchart of an operating method of a neural tensor compressor, according to an example embodiment of the inventive concept.

FIG. 7 is a flowchart of an operating method of the neural tensor compressor 140, according to an example embodiment of the inventive concept.

After operation S110, the neural tensor compressor 140 may extract the quadtree bit number QTB generated as a result of the quadtree compression (S121).

The neural tensor compressor 140 may extract the non-zero bit width NZW corresponding to the bit width of the non-zero cell having the largest cell value among the plurality of cells (S122).

The neural tensor compressor 140 may extract the zero count ZC corresponding to the number of cells having a zero cell value among the plurality of cells (S123). Next, the process may proceed to operation S130.

Figure 8:
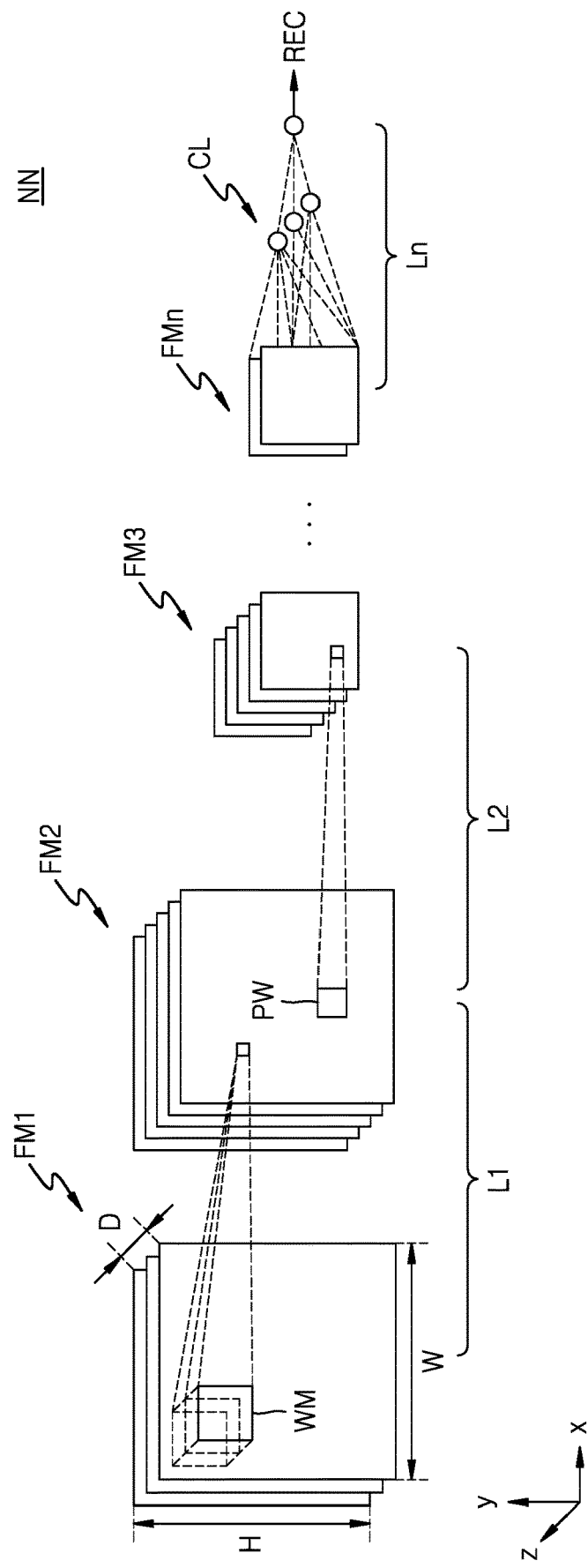
FIG. 8 is a diagram of a neural network, according to an example embodiment of the inventive concept.
Figure 9:
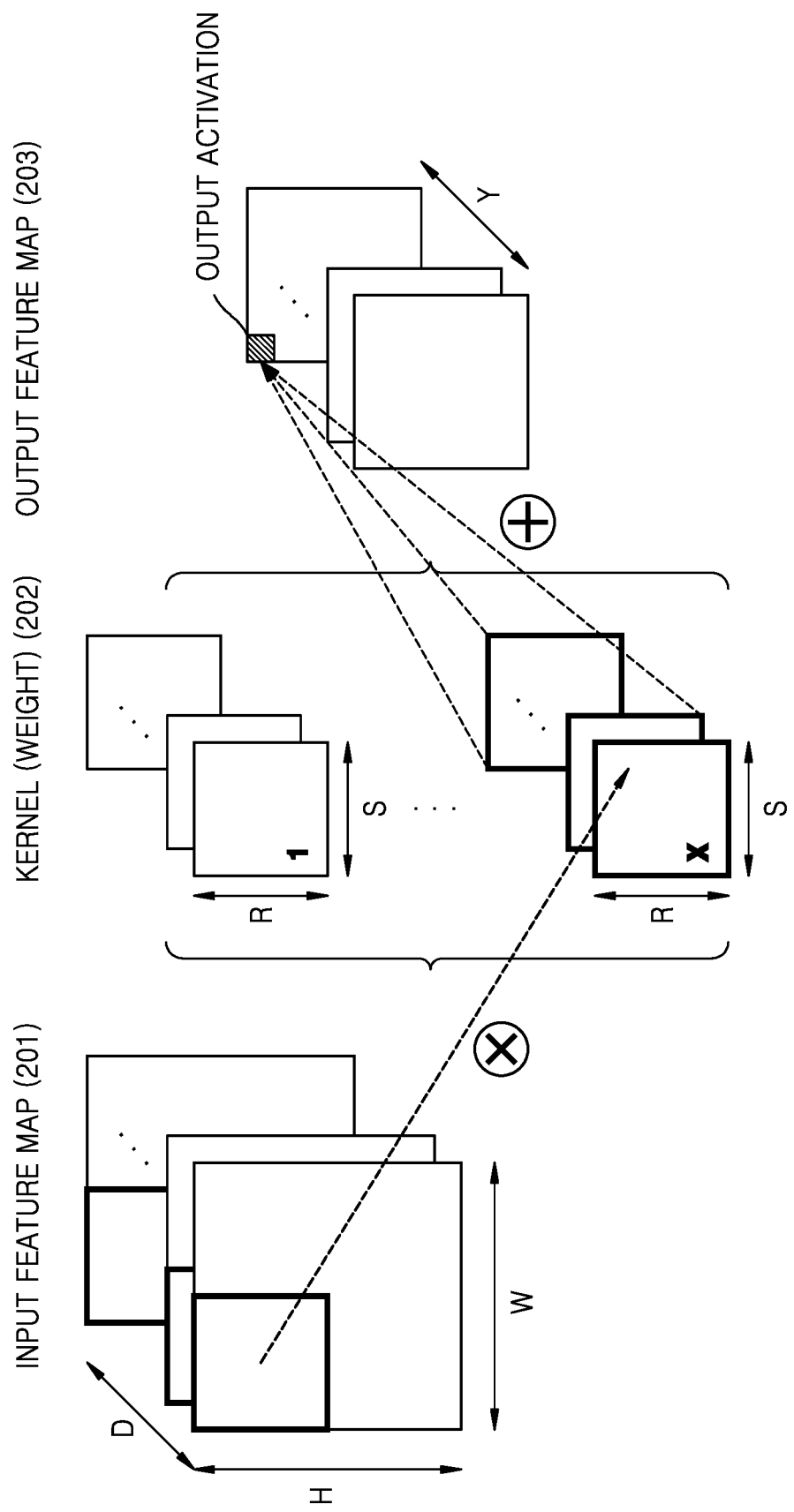
FIG. 9 is a diagram of a convolution computation of a neural network, according to an example embodiment of the inventive concept.

FIG. 8 is a diagram of a convolutional neural network structure as an example of the neural network structure, and FIG. 9 is a diagram of the convolution operation of a neural network NN, according to an example embodiment of the inventive concept.

Referring to FIG. 8, the neural network NN may include first through $n^{th}$ layers L1 through Ln. Each of the first through $n^{th}$ layers L1 through Ln may include a linear layer or a nonlinear layer, and in an embodiment, at least one linear layer and at least one nonlinear layer may be combined and referred to as a single layer. For example, the linear layer may include a convolution layer and a fully connected layer, and the nonlinear layer may include a pooling layer and an activation layer.

For example, the first layer L1 may be a convolutional layer, the second layer L2 may be a pooling layer, and the $n^{th}$ layer Ln may be a fully connected layer as an output layer. The neural network NN may further include an active layer, and may further include a layer performing other types of operations.

Each of the first through $n^{th}$ layers L1 through Ln may receive input data (for example, an image frame) or a feature map generated on a previous layer as an input feature map, and generate an output feature map or a recognition signal REC by calculating the input feature map. In this case, the feature map may be referred to as data representing various characteristics of input data. The first through $n^{th}$ feature maps FM1 through FMn may have a shape of, for example, a two dimensional matrix or a three dimensional matrix (or a tensor). The first through $n^{th}$ feature maps FM1 through FMn may have a width W (or number of columns), a height H (or number of rows), and a depth D, which correspond to an x-axis, a y-axis, and a z-axis, respectively. In this case, the depth D may be referred to as the number of channels.

The first layer L1 may generate the second feature map FM2 by convoluting the first feature map FM1 with a weight map WM. The weight map WM may filter the first feature map FM1, and may also be referred to as a filter or a kernel. The depth D of the weight map WM, that is, the number of channels, may be the same as the depth D of the first feature map FM1, that is, the number of channels, and the same channels of the weight map WM and the first feature map FM1 may be convoluted with each other. The weight map WM may be shifted by crossing the first feature map FM1 as a sliding window. An amount to be shifted may be referred to as a "stride length" or a "stride". During each shift, each of the weight values included in the weight map WM may be multiplied and added to all cell data in a region overlapping the first feature map FM1. Data of the first feature map FM1 in an area where each of weight values included in the weight map WM overlaps the first feature map FM1 may be referred to as extraction data. As the first feature map FM1 and the weight map WM are convoluted with each other, one channel of the second feature map FM2 may be generated. Although one weight map WM is illustrated in FIG. 3, a plurality of channels of the second feature map FM2 may be generated by substantially convoluting the plurality of weight maps WM with the first feature map FM1. For example, the number of channels of the second feature map FM2 may correspond to the number of weight maps WM.

The second layer L2 may generate the third feature map FM3 by changing a spatial size of the second feature map FM2 by using a pooling. The pooling may be referred to as a sampling or a down-sampling. A two-dimensional pooling window PW may be shifted on the second feature map FM2 in size units of the pooling window PW, and the maximum value (or an average value of cell data) may be selected from the cell data in the area overlapping the pooling window PW. Accordingly, the third feature map FM3 in which the spatial size has been changed from the second feature map FM2 may be generated. The number of channels of the third feature map FM3 and the number of channels of the second feature map FM2 may be the same as each other.

The $n^{th}$ layer Ln may classify classes CL of input data by combining features of the $n^{th}$ feature map FMn. In addition, the $n^{th}$ layer Ln may generate the recognition signal REC corresponding to the class CL. In an embodiment, the input data may correspond to frame data included in a video stream, and the $n^{th}$ layer Ln may recognize an object and generate the recognition signal REC corresponding to the recognized object by extracting the class CL corresponding to the object included in an image indicated by the frame data based on the $n^{th}$ feature map FMn provided by a previous layer.

Referring to FIG. 9, input feature maps 201 may include D channels, and the input feature map of each channel may have a size of H rows and W columns (D, H, and W are natural numbers). Each of kernels 202 may have a size of R rows and S columns (R and S are natural numbers), and the kernels 202 may include the number of channels corresponding to the channel number (or depth) D of the input feature maps 201. Output feature maps 203 may be generated by performing a three-dimensional convolution operation between the input feature maps 201 and the kernels 202, and may include Y channels according to the convolution operation (Y is a natural number).

The process of generating the output feature map 203 by applying the convolution operation between one input feature map 201 and one kernel 202 may be described with reference to FIG. 4B, and the output feature maps 203 of all channels may be generated by performing the two dimensional convolution operation described with reference to FIG. 4B between the input feature maps 201 of all channels and the kernels 202 of all channels.

Figure 10:
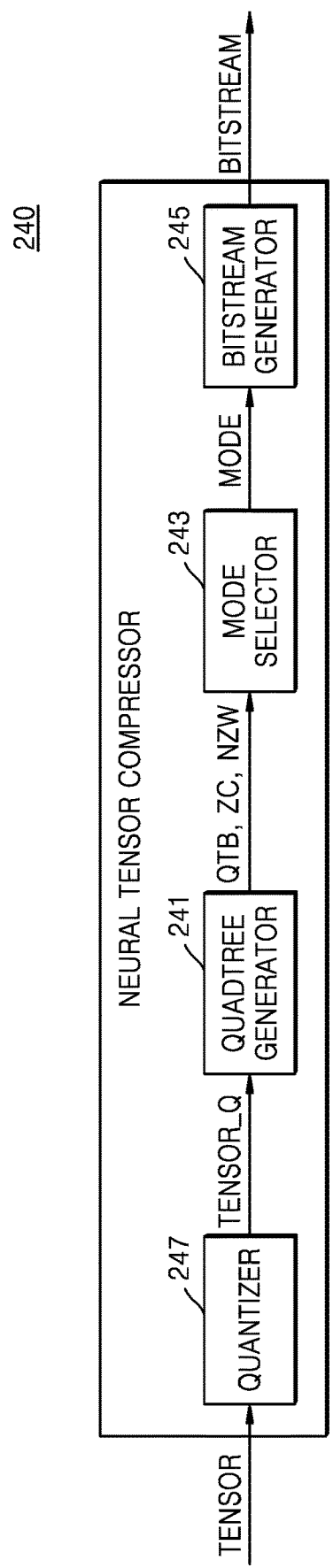
FIG. 10 is a block diagram of a neural tensor compressor further including a quantizer, according to an example embodiment of the inventive concept.

FIG. 10 is a block diagram of a neural tensor compressor 240 further including a quantizer 247, according to an example embodiment of the inventive concept.

The neural tensor compressor 240 may include a quadtree generator 241, a mode selector 243, a bitstream generator 245, and the quantizer 247. The quantizer 247 may receive a tensor TENSOR, quantize the received tensor TENSOR, and provide a quantized tensor TENSOR_Q to the quadtree generator 241. The quadtree generator 241 may receive the quantized tensor TENSOR_Q, and generate the quadtree by applying the quadtree method to the quantized tensor TENSOR_Q. The quadtree generator 241, the mode selector 243, and the bitstream generator 245 in FIG. 10 respectively correspond to the quadtree generator 141, the mode selector 143, and the bitstream generator 145 in FIG. 2, and thus duplicate descriptions thereof are omitted.

Because in many cases, the ReLU computation is applied to the convolution computation of the neural network NN, many zero cells may be distributed in the feature map and the tensor including the feature map. When there are many zero cells, it may be assumed that most of the cell values included in the tensor are relatively close to 0 together.

According to the technical idea of the inventive concept, the quantizer 247 may perform a non-uniform quantization. In an example embodiment, the quantizer 247 may perform the non-uniform quantization by using a characteristic that a tensor has many zero cells.

To the non-uniform quantization, Formula 4 below may be applied.

$$Q_{out} = \frac{\lfloor \text{input} + Qstep/2 \rfloor}{Qstep} + \text{offset} \qquad [\text{Formula 4}]$$

Referring to Formula 4, a non-uniform quantized value may correspond to a value that is obtained by adding a quantization step Qstep divided by 2 to an input, dividing a result of the decimal rounded-down value by the quantization step Qstep, and adding an offset to the result of the dividing. However, the inventive concept is not limited thereto, and various non-uniform quantization methods considering tensor characteristics may be applied.

The quantizer 247 according to the technical idea of the inventive concept may selectively perform the quantization. In an example embodiment, when the accuracy of the neural network processor 100 is highly required, the quantizer 247 may transfer the tensor TENSOR to the quadtree generator 241 without performing the quantization. For example, when the quantization is not performed, the quantized tensor TENSOR_Q may be the same as the tensor TENSOR. In an example embodiment, in the case of the neural network processor 100 operating in a low power mode or the neural network processor 100 mounted on a relatively inexpensive electronic device, the quantizer 247 may perform the non-uniform quantization.

When a uniform quantization is performed, data loss may occur in a low cell value in which a sensitive effect relatively occurs to the accuracy. When performing the non-uniform quantization, the neural tensor compressor 240 according to the technical idea of the inventive concept may not perform the quantization on cells having a low cell value related with data processing accuracy, and may greatly reduce a data compression rate by performing the quantization on cells having a high cell value and reducing the data loss.

Figure 11:
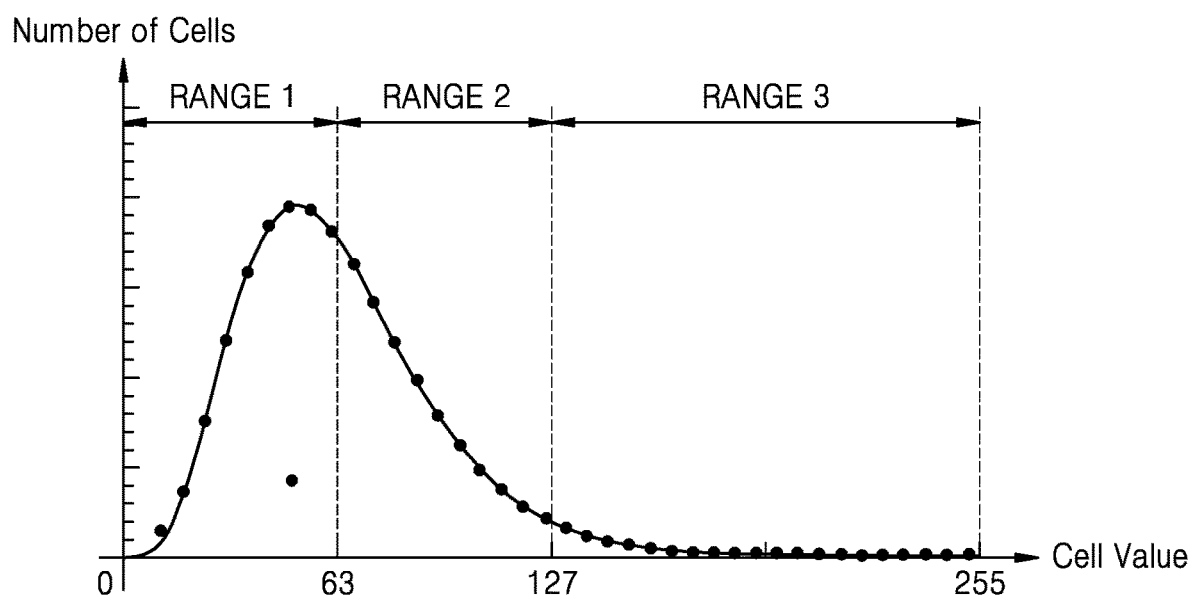
FIG. 11 is a graph of a cell distribution according to a cell value, according to an example embodiment of the inventive concept.

FIG. 11 is a graph of a cell distribution according to the cell value, according to an example embodiment of the inventive concept. The horizontal axis of the graph may mean the cell value, and the vertical axis may mean the number of cells.

Referring to FIG. 11, it is assumed that each of a plurality of cells included in a tensor has a cell value of up to 255. The quantization step Qstep may be categorized by dividing 255 or the maximum cell value by 4. For example, a quantization range may be divided into a quantization step 1 (that is, Qstep is 1) for a first range (wherein the cell values are 0 to 63) and the offset 0, a quantization step 2 (that is, Qstep is 2) for a second range (wherein the cell values are 64 to 127) and the offset 32, and a quantization step 3 (that is, Qstep is 4) for a third range (wherein the cell values are 128 to 255) and the offset 64. However, the embodiment is not limited thereto.

According to an example embodiment, because for the first range, the quantization step is 1 (or Qstep is 1) and the offset is 0, the non-uniform quantized value may include a value of 0 to 63.

According to an example embodiment, because for the second range, the quantization step is 2 (or Qstep is 1) and the offset is 32, the non-uniform quantized value may include a value of 64 to 95.

According to an example embodiment, because for the third range, the quantization step is 4 (or Qstep is 4) and the offset is 64, the non-uniform quantized value may include a value of 96 to 127.

The quantizer (e.g., quantizer 247 in FIG. 10) according to the technical concept of the inventive concept may quantize an 8-bit cell value having a value between 0 and 255 into a 7-bit cell value having a value between 0 and 127. Because the non-uniform quantization may omit the quantization for a range in which many cells have low cell values, data loss may be reduced, compared with the uniform quantization.

Figure 12:
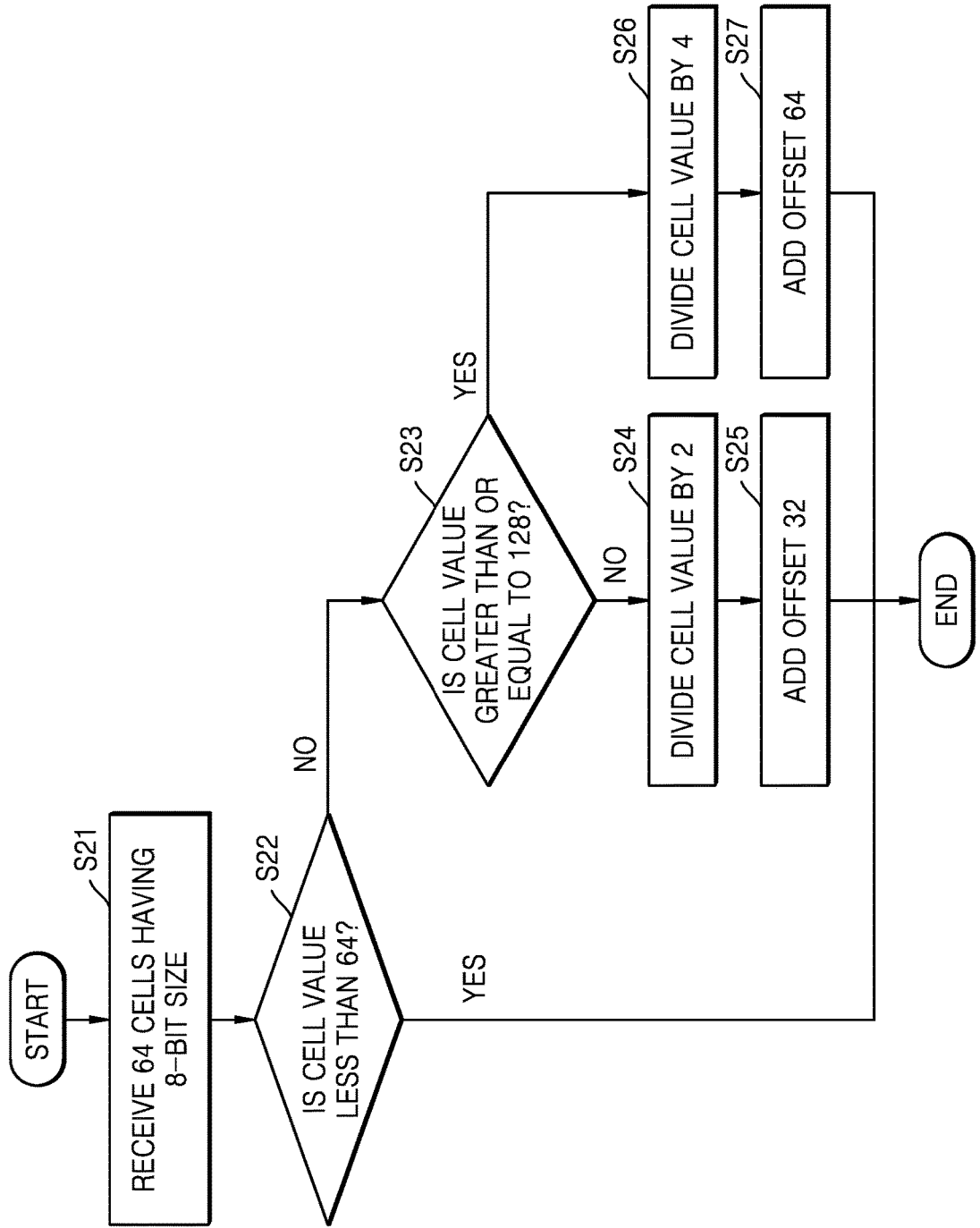
FIG. 12 is a flowchart of an operating method of a quantizer, according to an example embodiment of the inventive concept.

FIG. 12 is a flowchart of an operating method of the quantizer 247, according to an example embodiment of the inventive concept. FIG. 10 is referenced together.

The quantizer 247 may receive the tensor TENSOR (S21). The tensor TENSOR may include 64 cells of an 8-bit size.

The quantizer 247 may divide a range of cell values of the 8-bit size (S22). The quantizer 247 may identify whether the cell value is less than 64 (S22). When the cell value is less than 64 (S22, YES), the cell may not be quantized and may be provided to the quadtree generator 241. When the cell value is 64 or more (S22, NO), the process may proceed to operation S23.

The quantizer 247 may identify whether the cell value is 128 or more (S23).

When the cell value is less than 128 (S23, NO), the quantizer 247 may divide the cell value by 2 (S24), and add the offset 32 to the divided cell value (S25).

When the cell value is 128 or more (S23, YES), the quantizer 247 may divide the cell value by 4 (S26), and add the offset 64 to the divided cell value (S27).

Figure 13:
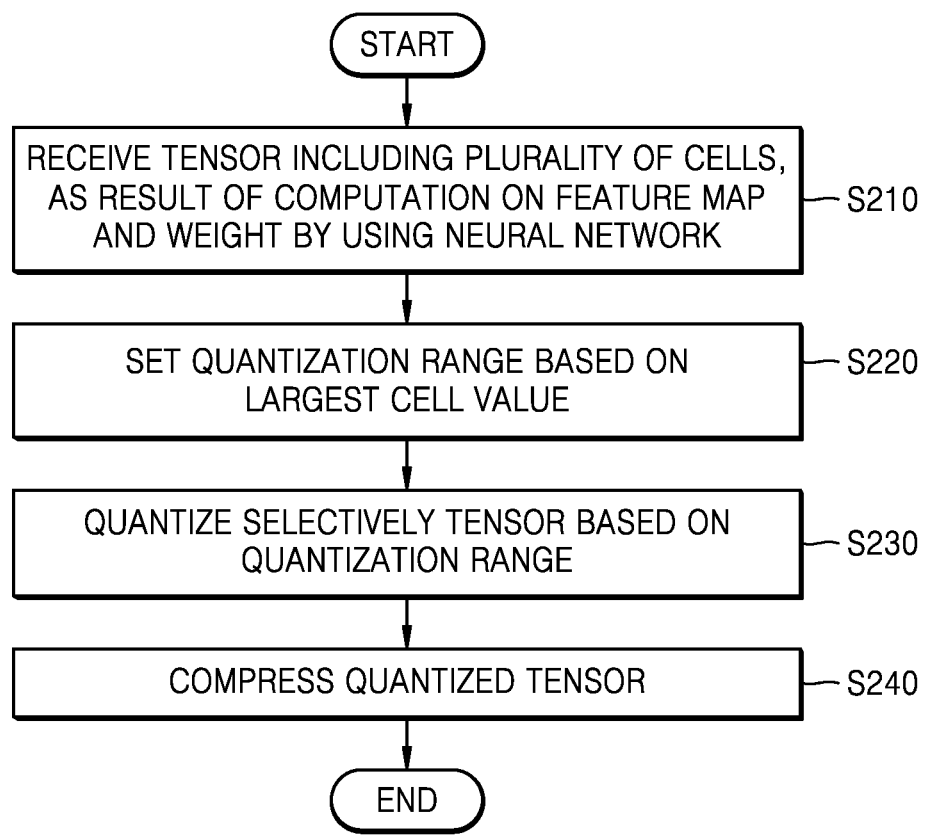
FIG. 13 is a flowchart of an operating method of a neural tensor compressor, according to an example embodiment of the inventive concept.

FIG. 13 is a flowchart of an operating method of the neural tensor compressor 240, according to an example embodiment of the inventive concept. FIG. 10 is referenced together with FIG. 13.

The neural tensor compressor 240 may receive a tensor including a plurality of cells as a result of computation on a feature map and weight by using the neural network (S210).

The neural tensor compressor 240 may set the quantization range of the tensor based on a cell having the maximum value among the plurality of cells (S220).

The neural tensor compressor 240 may selectively quantize the tensor based on the quantization range (S230). In an example embodiment, the neural tensor compressor 240 may quantize a cell included in the second range without quantizing a cell included in the first range. For example, the first range may include a low cell value region, and the second range may include a relatively high cell value region, but are not limited thereto.

The neural tensor compressor 240 may extract the plurality of parameters by applying a quadtree data structure to the quantized tensor TENSOR_Q (S240).

The neural tensor compressor 240 may determine whether the quadtree-based bitstream has been generated based on the plurality of parameters (for example, NZW, ZC, and QTB) (S250).

Figure 14:
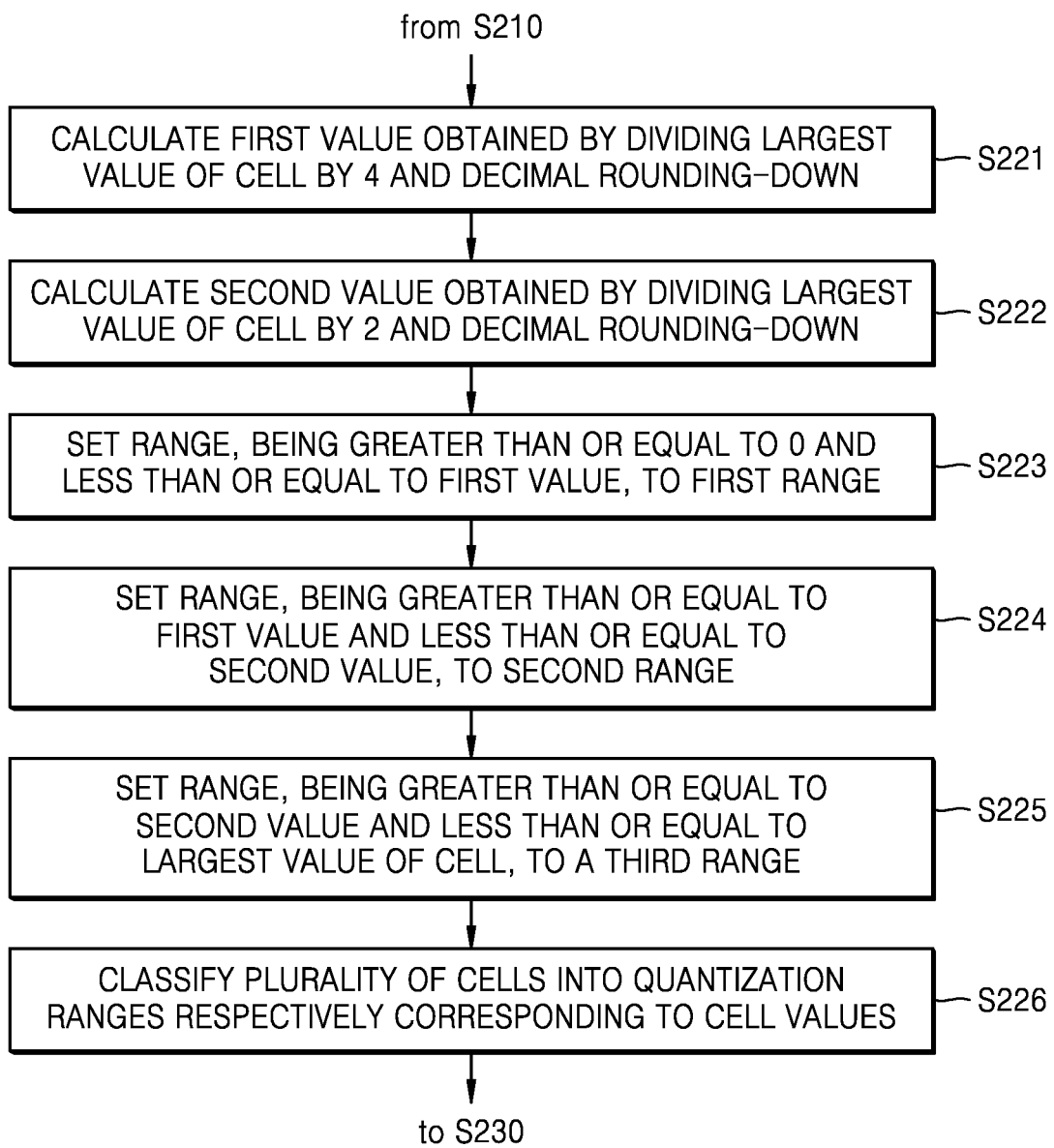
FIG. 14 is a flowchart of an operating method of a neural tensor compressor, according to an example embodiment of the inventive concept.

FIG. 14 is a flowchart of an operating method of the neural tensor compressor 240, according to an example embodiment of the inventive concept.

After operation S210, the quantizer 247 may calculate a first value obtained by dividing the largest value of the cell by 4 and decimal rounding-down (S221).

The quantizer 247 may calculate a second value obtained by dividing the largest value of the cell value by 2 and decimal rounding-down (S222).

The quantizer 247 may set the first quantization range as being greater than or equal to 0 and less than or equal to the first value (S223).

The quantizer 247 may set a second quantization range as being greater than or equal to the first value and less than or equal to a second value (S224).

The quantizer 247 may set a third quantization range as being greater than or equal to the second value and less than or equal to the largest cell value (S225).

The quantizer 247 may classify the plurality of cells into quantization ranges respectively corresponding to cell values (S226).

Next, the process may proceed to operation S230.

Figure 15:
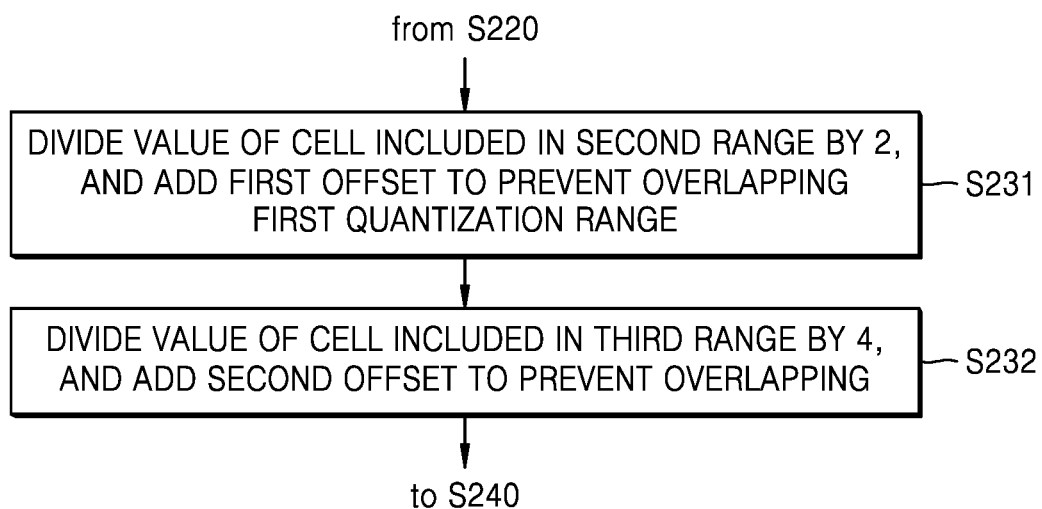
FIG. 15 is a flowchart of an operating method of a neural tensor compressor, according to an example embodiment of the inventive concept.

FIG. 15 is a flowchart of an operating method of the neural tensor compressor 240, according to an example embodiment of the inventive concept.

After operation S220, the quantizer 247 may divide the cell value of the cell included in the second quantization range by 2, and add the result of division and a first offset to prevent overlapping the first quantization range (S231).

The quantizer 247 may divide the cell value of the cell included in the third quantization range by 4, and add the result of division and a second offset to prevent overlapping the second quantization range (S232).

Next, the process may proceed to operation S240.

Figure 16:
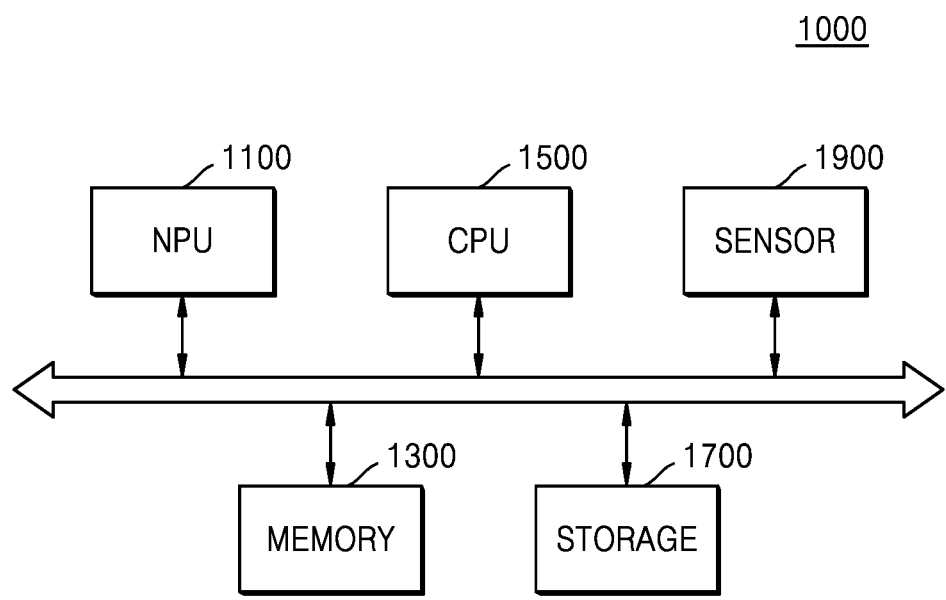
FIG. 16 is a block diagram of an electronic system according to an example embodiment of the inventive concept.

FIG. 16 is a block diagram of an electronic system 1000, according to an example embodiment of the inventive concept.

Referring to FIG. 16, the electronic system 100 may analyze input data in real time based on the neural network NN, extract valid information, make a situation determination based on the extracted information, and control the components of the electronic system 1000. For example, the electronic system 100 may be applied to a drone, an ADAS, a robot device, a smart TV, a smart phone, a medical device, a mobile device, an image display device, a measurement device, internet of things (IoT) devices, and the like, and in addition, may be mounted on one of various kinds of electronic devices.

The electronic system 1000 may include various types of intellectual property (IP) blocks in addition to the illustrated functional units. As used herein, intellectual property (IP) or IP blocks may also be referred to as intellectual property cores, and may be used to denote self-contained discrete units that provide a macro function to the system. Those skilled in the art will appreciate that the disclosed intellectual property or intellectual property cores are physically implemented by electronic (or optical) circuits, such as logic circuits, discrete components, microprocessors, hard-wired circuits, memory elements, wiring connections, buses, communication links, and the like, which may be formed using semiconductor-based fabrication techniques or other manufacturing technologies. For example, the IP blocks may include a processing unit, a plurality of cores included in the processing unit, a multi-format codec (MFC), a video module (for example, a camera interface, a joint photographic experts group (JPEG) processor, a video processor, a mixer, or the like), a 3D graphics core, an audio system, a driver, a display driver, a volatile memory, a non-volatile memory, a memory controller, an input and output interface block, a cache memory, etc.

A technology for connecting IPs may include a connection method based on a system bus. For example, as a standard specification of a bus, an advanced microcontroller bus architecture (AMBA) protocol of Advanced RISC Machine (ARM) may be applied. A bus type of the AMBA protocol may include advanced high-performance bus (AHB), advanced peripheral bus (APB), advanced extensible interface (AXI), AXI4, AXI coherency extensions (ACE), or the like. Among the bus types described above, the AXI may be an interface protocol between IPs, and may provide a function of multiple outstanding address, data interleaving, or the like. In addition, other types of protocols may also be applied, such as SONIC uNetwork, IBM CoreConnect, and open core protocol of OCP-IP.

A neural network processor (or neural processing unit (NPU)) 1100 may receive various types of input data via a system bus, and generate an information signal based on the input data. For example, the NPU 1100 may generate the information signal by performing a neural network operation on the input data, and the neural network operation may include the convolution operation.

A memory 1300 may be a storage area for storing data, and may store, for example, an operating system (OS), various programs, and various data. The memory 1300 may be a dynamic random access memory (RAM)(DRAM), but is not limited thereto. The memory 1300 may include a volatile memory. The volatile memory may include DRAM, static RAM (SRAM), synchronous DRAM (SDRAM), phase-change RAM (PRAM), magnetic RAM (MRAM), resistive RAM (RRAM), ferroelectric RAM (FeRAM), etc.

A CPU 1500 may control all operations of the electronic system 1000, and for example, the CPU 1500 may include a central processing unit (CPU). The CPU 1500 may include one processor core (or a single core) or a plurality of processor cores (or a multi-core). The CPU 1500 may process or execute programs and/or data stored in the memory 1040. For example, the CPU 1500 may control functions of the electronic system 1000 by executing programs stored in the memory 1300.

A storage 1700 may be a storage location for storing data, and may store various programs and various data. The storage 1700 may include a non-volatile memory. The non-volatile memory may include read-only memory (ROM), programmable ROM (PROM), electrically programmable ROM (EPROM), electrically erasable PROM (EEPROM), a flash memory, phase-change random-access memory (RAM) (PRAM), magnetic RAM (MRAM), resistive RAM (RRAM), ferroelectric RAM (FRAM), and etc. In addition, in an embodiment, the storage 1700 may include at least one of a hard disk drive (HDD), a solid state drive (SSD), a compact flash (CF) storage, a secure digital (SD) storage, a micro secure digital Secure digital) storage, an extreme digital (xD), and a memory stick.

A sensor 1900 may collect information around the electronic system 1000. The sensor 1900 may sense or receive an image signal from outside the electronic system 1000, and convert the sensed or received image signal into image data, that is, an image frame. To this end, the sensor 1900 may include at least one of various types of sensing devices, such as an imaging device, an image sensor, a light detection and ranging (LIDAR) sensor, an ultrasonic sensor, and an infrared sensor, or may receive the sensing signal from the sensing device. In an embodiment, the sensor 1900 may provide an image frame to the neural network processor 1100. For example, the sensor 1900 may include the image sensor, generate a video stream by photographing the external environment of the electronic system 1000, and sequentially provide continuous image frames of the video stream to the neural network processor 1100.

While the inventive concept has been particularly shown and described with reference to embodiments thereof, it will be understood that various changes in form and details may be made therein without departing from the spirit and scope of the following claims.

What is claimed is:

1. A compression method of a neural network processor configured to perform computations on a feature map and a weight by using a neural network, the method comprising:
 receiving a tensor comprising a plurality of cells as a result of the computations;
 setting a quantization range of the tensor based on a largest value of a cell among the plurality of cells;
 selectively quantizing the tensor based on the quantization range; and
 compressing the quantized tensor.

2. The method of claim 1, wherein the setting of the quantization range comprises:
 calculating a first value obtained by dividing the largest value of the cell by 4 and decimal rounding-down;
 calculating a second value obtained by dividing the largest value of the cell by 2 and decimal rounding-down;
 setting a range that is greater than or equal to 0 and less than or equal to a first value, to a first range;
 setting a range that is greater than or equal to the first value and less than or equal to a second value, to a second range;
 setting a range that is greater than or equal to the second value and less than or equal to the largest value of the cell, to a third range; and
 classifying the plurality of cells into quantization ranges respectively corresponding to cell values.

3. The method of claim 2, wherein the selectively quantizing the tensor comprises:
 dividing a value of a cell comprised in the second range by 2, and adding a first offset to prevent overlapping the first range; and
 dividing a value of a cell comprised in the third range by 4, and adding a second offset to prevent overlapping the second range.

4. The method of claim 1, wherein the compressing of the quantized tensor comprises:
 extracting a first parameter generated as a result of a quadtree and corresponding to a total number of bits in which location information about a non-zero cell is represented in the tensor;
 extracting a second parameter corresponding to bits from a least significant bit to a bit having a non-zero largest digit, when a cell having a largest value among the non-zero cells is expressed in binary; and
 extracting a third parameter corresponding to a number of zero cells among the plurality of cells.

5. The method of claim 4, wherein the compressing of the quantized tensor comprises:
 comparing a value of the first parameter to a number of cells included in the tensor; and
 when the value of the first parameter is less than or equal to the number of cells included in the tensor, select a first compression mode, in which the tensor is compressed in a quadtree method, as a compression mode.

6. The method of claim 5, wherein the compressing of the quantized tensor comprises:
when the value of the first parameter is greater than the number of cells included in the tensor, comparing a product value of a value of the second parameter and a value of the third parameter with the number of cells; and
when the product value of the value of the second parameter and the value of the third parameter exceeds the number of cells, select a second compression mode, in which the tensor is compressed in a zero bitmap method in which the non-zero cell is regarded as 1 and a zero cell is regarded as 0, as a compression mode.

7. The method of claim 6, wherein the compressing of the quantized tensor comprises:
when the product value of the value of the second parameter and the value of the third parameter is less than or equal to the number of cells, select a third compression mode, in which the tensor is compressed in a fixed length method in which the tensor is compressed based on a bit width of a cell of a largest value among the plurality of cells, as a compression mode.

8. A device configured to compress a tensor comprising a plurality of cells, the device comprising:
a quantizer configured to quantize the tensor;
a quadtree generator configured to generate a quadtree searching for a non-zero cell comprised in the quantized tensor and extract at least one parameter from the quadtree;
a mode selector configured to determine a compression mode based on the at least one parameter; and
a bitstream generator configured to generate a bitstream by compressing the quantized tensor based on the compression mode.

9. The device of claim 8, wherein the quantizer is further configured to set a quantization range of the tensor based on a largest value of a cell among the plurality of cells, and selectively quantize the tensor based on the quantization range.

10. The device of claim 9, wherein the quantizer is further configured to calculate a first value obtained by dividing the largest value of the cell by 4 and decimal rounding-down, calculate a second value obtained by dividing the largest value of the cell by 2 and decimal rounding-down, set a range that is greater than or equal to 0 and less than or equal to a first value to a first range, set a range that is greater than or equal to the first value and less than or equal to a second value to a second range, set a range that is greater than or equal to the second value and less than or equal to the largest value of the cell to a third range, and classify the plurality of cells into quantization ranges respectively corresponding to cell values.

11. The device of claim 10, wherein the quantizer is further configured to divide a value of a cell comprised in the second range by 2, add a first offset to a divided value of the cell comprised in the second range, divide a value of a cell comprised in the third range by 4, and add a second offset to a divided value of the cell comprised in the third range.

12. The device of claim 8, wherein the at least one parameter comprises:
a first parameter generated as a result of the quadtree and corresponding to a total number of bits in which location information about the non-zero cell is represented;
a second parameter corresponding to a number of bits from a least significant bit to a bit of a non-zero largest digit, in response to a cell having a largest value among non-zero cells being expressed in binary; and
a third parameter corresponding to a number of zero cells among the plurality of cells.

13. The device of claim 12, wherein the mode selector is further configured to select a first compression mode, in which the tensor is compressed in a quadtree method, as the compression mode, in response to a value of the first parameter being less than or equal to a number of cells included in the tensor.

14. The device of claim 12, wherein the mode selector is further configured to select a second compression mode, in which the tensor is compressed in a zero bitmap method in which the non-zero cell is regarded as 1 and a zero cell is regarded as 0, as the compression mode, in response to a value of the first parameter exceeding a number of cells included in the tensor and a product value of a value of the second parameter and a value of the third parameter exceeding the number of cells.

15. The device of claim 12, wherein the mode selector is further configured to select a third compression mode, in which the tensor is compressed in a fixed length method in which the tensor is compressed based on a bit width of a cell of a largest value among the plurality of cells, as the compression mode, in response to a value of the first parameter exceeding a number of cells included in the tensor and a product value of a value of the second parameter and a value of the third parameter being less than or equal to the number of cells.

16. A neural network processor comprising:
an arithmetic circuit configured to generate a tensor comprising a plurality of cells by performing a computation on input data by using a neural network; and
a neural tensor compressor configured to output a bitstream by compressing the tensor,
wherein the neural tensor compressor is further configured to quantize the tensor, to generate a quadtree corresponding to a repetitive spatial division method to search for a non-zero cell comprised in the quantized tensor, extract at least one parameter from the quadtree, and determine a compression mode of the bitstream based on the at least one parameter.

17. The neural network processor of claim 16, wherein the neural tensor compressor is further configured to set a quantization range of the tensor based on a largest value of a cell among the plurality of cells, and selectively quantize the tensor based on the quantization range.

18. The neural network processor of claim 17, wherein the neural tensor compressor is further configured to calculate a first value obtained by dividing the largest value of the cell by 4 and decimal rounding-down, calculate a second value obtained by dividing the largest value of the cell by 2 and decimal rounding-down, set a range that is greater than or equal to 0 and less than or equal to a first value to a first range, set a range that is greater than or equal to the first value and less than or equal to a second value to a second range, set a range that is greater than or equal to the second value and less than or equal to the largest value of the cell to a third range, and classify the plurality of cells into quantization ranges respectively corresponding to cell values.

19. The neural network processor of claim 18, wherein the neural tensor compressor is further configured to divide a value of a cell comprised in the second range by 2, add a first offset to a divided value of the cell comprised in the second range, divide a value of a cell comprised in the third range by 4, and add a second offset to a divided value of the cell comprised in the third range.

20. The neural network processor of claim 16, wherein the at least one parameter comprises:
   a first parameter generated as a result of the quadtree and corresponding to a total number of bits in which location information about the non-zero cell is represented;
   a second parameter corresponding to a number of bits from a least significant bit to a bit of a non-zero largest digit, in response to a cell having a largest value among non-zero cells being expressed in binary; and
   a third parameter corresponding to a number of zero cells among the plurality of cells.

* * * * *